(12) United States Patent
Fukudome et al.

(10) Patent No.: US 12,256,580 B2
(45) Date of Patent: Mar. 18, 2025

(54) SEMICONDUCTOR DEVICE

(71) Applicant: Nuvoton Technology Corporation Japan, Kyoto (JP)

(72) Inventors: Toshiya Fukudome, Toyama (JP); Koji Nakatsu, Toyama (JP); Shigeo Hayashi, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 424 days.

(21) Appl. No.: 17/826,929

(22) Filed: May 27, 2022

(65) Prior Publication Data

US 2022/0293831 A1  Sep. 15, 2022

Related U.S. Application Data

(63) Continuation-in-part of application No. PCT/JP2020/041787, filed on Nov. 9, 2020.

(30) Foreign Application Priority Data

Dec. 11, 2019  (JP) .................. 2019-223986

(51) Int. Cl.
*H10H 20/854* (2025.01)
*H10H 20/856* (2025.01)

(52) U.S. Cl.
CPC ........ *H10H 20/854* (2025.01); *H10H 20/856* (2025.01)

(58) Field of Classification Search
CPC ....... H01L 33/60; H01L 33/56; H01L 33/647; H01L 33/62; H01L 33/486; H01L 33/642; H01L 33/0095; H01L 24/96; H01L 25/167; H01L 24/73; H01L 33/52; H01L 33/54; H01L 33/58; H01L 24/97; H01L 24/26;
(Continued)

(56) References Cited

U.S. PATENT DOCUMENTS

2009/0061721 A1   3/2009  Isa
2009/0091045 A1   4/2009  Tanikawa et al.
(Continued)

FOREIGN PATENT DOCUMENTS

JP   2009-076877 A   4/2009
JP   2010-219324 A   9/2010
(Continued)

OTHER PUBLICATIONS

International Search Report issued on Jan. 12, 2021 in International Patent Application No. PCT/JP2020/041787, with English translation.
(Continued)

*Primary Examiner* — Mouloucoulaye Inoussa
(74) *Attorney, Agent, or Firm* — Rimon P.C.

(57) ABSTRACT

A semiconductor device includes: a mounting substrate; a thin cured silicone resin material film above and in contact with the mounting substrate; and a first cured silicone resin material in contact with the thin cured silicone resin material film. In the semiconductor device, an oxygen content per unit volume in the whole region in a thickness direction of the thin cured silicone resin material film is higher than an oxygen content per unit volume in the whole region in the thickness direction of the first cured silicone resin material.

19 Claims, 15 Drawing Sheets

(58) Field of Classification Search
CPC ... H01L 27/0248; H01L 33/505; H01L 23/24; H01L 25/0753; H01L 29/866; H01L 25/072; H01L 21/3213; H01L 2224/16245; H01L 33/483; H01L 33/504; H01L 27/15; H01L 33/502; H01L 33/44; H01L 2933/0091; H01L 2933/005; H01L 2924/19105; H01L 2224/73204; H01L 2924/1426; H01L 2224/97; H01L 2924/12041; H01L 2933/0041; H01L 2924/1304; H01L 2224/16227; H01L 2224/92225; H01L 2224/32225; H01L 2224/26155; H01L 2933/0033; H01L 2224/26175; H01L 2924/12035; H01L 2924/1811; H01L 2224/73253; H01L 2224/81; H01L 2224/83; H01L 2224/16225; H01L 2933/0058; H01L 2224/48091; H01L 2224/48247
See application file for complete search history.

(56) References Cited

U.S. PATENT DOCUMENTS

| | | | |
|---|---|---|---|
| 2012/0104452 A1 | 5/2012 | Miyoshi et al. | |
| 2012/0138997 A1 | 6/2012 | Tasaki et al. | |
| 2016/0093780 A1* | 3/2016 | Beppu | H01L 21/3213 438/27 |
| 2016/0249474 A1* | 8/2016 | Yang | H01M 50/186 |
| 2017/0033267 A1* | 2/2017 | Tamaki | H01L 33/508 |
| 2017/0154880 A1* | 6/2017 | Ozeki | H01L 33/0095 |
| 2018/0175265 A1* | 6/2018 | Kim | H01L 33/60 |
| 2020/0321501 A1* | 10/2020 | Nakabayashi | H01L 33/647 |
| 2020/0363364 A1* | 11/2020 | Yang | G02F 1/1339 |
| 2020/0403127 A1* | 12/2020 | Yamashita | H01L 33/52 |
| 2020/0411732 A1* | 12/2020 | Yun | H01L 33/56 |

FOREIGN PATENT DOCUMENTS

| | | |
|---|---|---|
| JP | 2012-099544 A | 5/2012 |
| JP | 2013-175751 A | 9/2013 |
| JP | 2017-075203 A | 4/2017 |
| JP | 2019-021742 A | 2/2019 |
| WO | 2007/125956 A1 | 11/2007 |
| WO | 2011/118108 A1 | 9/2011 |

OTHER PUBLICATIONS

Chinese Office Action dated Aug. 14, 2024 issued in the corresponding Chinese Patent Application No. 202080081073.1, with English translation of the Search Report.

* cited by examiner

US 12,256,580 B2

SEMICONDUCTOR DEVICE

CROSS REFERENCE TO RELATED APPLICATIONS

The present application is a continuation-in-part of PCT International Application No. PCT/JP2020/041787 filed on Nov. 9, 2020, and claims the benefit of Japanese Patent Application No. 2019-223986 filed on Dec. 11, 2019. The entire disclosures of the above-identified applications, including the specifications, drawings and claims are incorporated herein by reference in their entireties.

FIELD

The present disclosure relates to a semiconductor device.

BACKGROUND

Conventionally, semiconductor devices having a light emitting diode (LED) package structure in which a light-transmissive member is adhered to and above a light-emitting element using a light guiding member have been used as semiconductor devices. For example, Patent Literature (PTL) 1 discloses a light-emitting device that includes a light-emitting element mounted on a substrate, a light-transmissive member above the light-emitting element, a light-guiding member joining the light-emitting element and the light-transmissive member together, and a covering member covering the surfaces of the substrate, the light-emitting element, the light-transmissive member, and the light-guiding member. The light-guiding member and the covering member include, for example, a resin member such as a cured silicone resin material.

CITATION LIST

Patent Literature

PTL 1: Japanese Unexamined Patent Application Publication No. 2010-219324

SUMMARY

Technical Problem

In semiconductor devices, prevention of separation between members of semiconductor devices and resin members, such as a cured silicone resin material, which cover the members of the semiconductor devices is sought after. In view of the above, the present disclosure aims to provide a semiconductor device that can prevent separation of a cured silicone resin material that covers a member of the semiconductor device.

Solution to Problem

In order to provide such a semiconductor device, a semiconductor device according to one aspect of the present disclosure includes: a base; a thin cured silicone resin material film above and in contact with the base; and a first cured silicone resin material in contact with the thin cured silicone resin material film. In a whole region in a thickness direction, an oxygen content per unit volume of the thin cured silicone resin material film is higher than an oxygen content per unit volume of the first cured silicone resin material.

Advantageous Effect

According to the present disclosure, a semiconductor device can prevent separation of a cured silicone resin material that covers a member of the semiconductor device.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Background to Attaining One Aspect of the Present Disclosure

First, prior to describing embodiments of the present disclosure, the background to attaining one aspect of the present disclosure will be described.

Typically, as PTL 1 discloses, LED packages that use silicone resin have been manufactured. It should be noted that, unless otherwise specified, "silicone resin" in this specification indicates liquid silicone resin before it is cured.

In this manufacturing method, the inventors of the present disclosure have found that part of silicone resin evaporates and scatters before the silicone resin is cured, and a scattered coating of a cured silicone resin material is formed on members in the vicinity by the time the silicone resin is thermally cured. Furthermore, the inventors have found a reduction in adhesion between a member, such as a mounting substrate on which a thin cured silicone resin material film is formed, and a cured silicone resin material that covers each member.

Therefore, the present disclosure aims to provide a semiconductor device that can prevent separation of a cured silicone resin material that covers a member of the semiconductor device, even when a thin cured silicone resin material film is generated on the member of the semiconductor device.

Hereinafter, embodiments according to the present disclosure will be described with reference to the drawings. Note that the embodiments described below each show a specific example of the present disclosure. Therefore, the numerical values, shapes, materials, structural elements, the arrangement and connection of the structural elements, steps (processes), the order of the steps, and the like described in the following embodiments are mere examples, and thus are not intended to limit the present disclosure.

It should be noted that the drawings are schematic diagrams, and do not necessarily provide strictly accurate illustration. Accordingly, the drawings do not necessarily coincide with each other in terms of scales and the like. Throughout the drawings, the same numeral is given to substantially the same element, and redundant description is omitted or simplified.

Moreover, in the following embodiments, terms "upper/above" and "lower/below" do not indicate an upward direction (vertically upward) and a downward direction (vertically downward) in absolute spatial cognition. The terms "upper/above" and "lower/below" are applied, not only when two elements are disposed spaced apart with another element interposed between the two elements, but also when the two elements adhere to each other and are in contact with each other.

Embodiment 1

A semiconductor device according to Embodiment 1 will be described.

[Overall Configuration]

Figure 1:
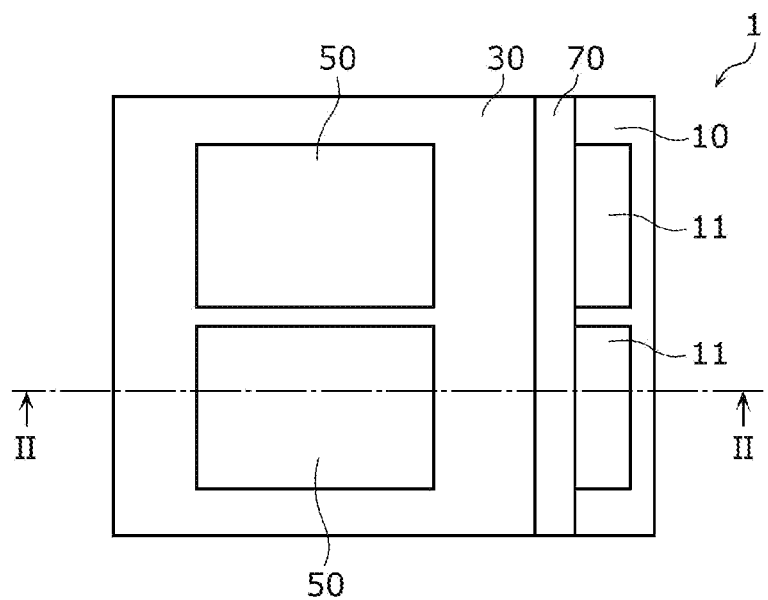
FIG. 1 is a top view illustrating a configuration of a semiconductor device according to Embodiment 1.
Figure 2:
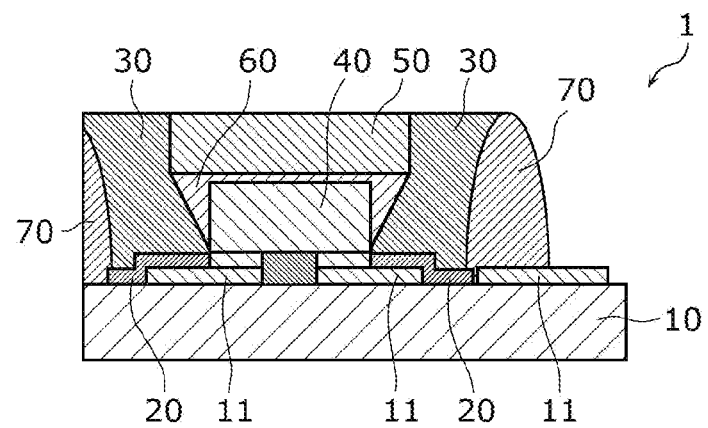
FIG. 2 is a cross-sectional view of FIG. 1 taken along line II-II.

First, an overall configuration of semiconductor device 1 according to Embodiment 1 will be described with reference to FIG. 1 and FIG. 2. FIG. 1 is a top view illustrating a configuration of semiconductor device 1 according to Embodiment 1. FIG. 2 is a cross-sectional view of FIG. 1 taken along line II-II.

As illustrated in FIG. 1 and FIG. 2, semiconductor device 1 includes mounting substrate 10 on which conductive pattern 11 is formed, thin cured silicone resin material film 20, first cured silicone resin material 30, light-emitting elements 40, light-transmissive members 50, second cured silicone resin materials 60, and third cured silicone resin material 70. In this embodiment, semiconductor device 1 is a light-emitting device in which light-emitting elements 40 are mounted above mounting substrate 10.

Mounting substrate 10 is, for example, a ceramic substrate including a sintered body of aluminum nitride (AlN). In this embodiment, mounting substrate 10 is one example of a base. Mounting substrate 10 may be a metallic substrate or a resin substrate. Conductive pattern 11 is a conductive layer formed on mounting substrate 10 which is electrically connected with light-emitting elements 40. For example, conductive pattern 11 includes copper, silver, gold, aluminum, or the like.

Thin cured silicone resin material film 20 is disposed above mounting substrate 10, and is in contact with mounting substrate 10. Thin cured silicone resin material film 20 is also in contact with first cured silicone resin material 30. Thin cured silicone resin material film 20 is disposed between mounting substrate 10 and first cured silicone resin material 30. Moreover, in a plan view of mounting substrate 10, a part of or all of thin cured silicone resin material film 20 is also in contact with conductive pattern 11 and third cured silicone resin material 70. In a plan view of mounting substrate 10, thin cured silicone resin material film 20 is disposed around and in the vicinity of side faces of light-emitting elements 40. At least in a plan view of mounting substrate 10, thin cured silicone resin material film 20 is disposed in a region within 3 mm from the side faces of light-emitting elements 40, for example. Thin cured silicone resin material film 20 is adjacent to light-emitting elements 40, but in a plan view of mounting substrate 10, thin cured silicone resin material film 20 and light-emitting elements 40 may be disposed apart from each other.

Thin cured silicone resin material film 20 is, for example, a thin film that is a scattered coating which has been altered. The scattered coating is formed due to evaporation and scattering of part of silicone resin provided for forming a cured silicone resin material. The thickness of thin cured silicone resin material film 20 is, for example, less than or equal to 0.1 μm. Thin cured silicone resin material film 20 contains a coupling agent, and, as silicone that is the principal component, silicone including a hydrocarbon group in a side chain, such as polydimethyl silicone, polydiphenyl silicone, or the like, which has been altered due to oxidation. The coupling agent is, for example, a silane coupling agent including, in one molecule, a functional group such as a vinyl group or an epoxy group for bonding to a macromolecule such as silicone in resin, and a functional group such as an OH group for bonding to a base including an OH group such as a mounting substrate.

In the whole region in a thickness direction, an oxygen content per unit volume of thin cured silicone resin material film 20 is higher than an oxygen content per unit volume of first cured silicone resin material 30. In other words, at any position in the thickness direction, an oxygen content per unit volume of thin cured silicone resin material film 20 is higher than an oxygen content per unit volume of first cured silicone resin material 30. For example, at the same position in a plan view of thin cured silicone resin material film 20, an oxygen content per unit volume of thin cured silicone resin material film 20 in the whole region in a thickness direction is higher than an oxygen content per unit volume of first cured silicone resin material 30 in the whole region in the thickness direction. An oxygen content in the present disclosure is calculated from an amount of $SiO_2$-based fragment ions measured using, for example, Time-Of-Flight Secondary Ion Mass Spectrometry (TOF-SIMS). A specific calculation method will be described later. Accordingly, OH groups are likely to exist on a surface of thin cured silicone resin material film 20.

First cured silicone resin material 30 is a resin member for covering each of the members, such as light-emitting elements 40. First cured silicone resin material 30 is in contact with the top face of thin cured silicone resin material film 20. First cured silicone resin material 30 is also in contact with side faces of each of light-transmissive members 50, second cured silicone resin materials 60, and third cured silicone resin material 70. First cured silicone resin material 30 is disposed in a region surrounded by third cured silicone resin material 70, mounting substrate 10, and light-emitting elements 40. In a plan view of mounting substrate 10, first cured silicone resin material 30 is disposed around light-emitting elements 40, light-transmissive members 50, and second cured silicone resin materials 60, and covers the foregoing members. Moreover, first cured silicone resin material 30 covers the upper side of mounting substrate 10. Note that first cured silicone resin material 30 may be in contact with mounting substrate 10 and light-emitting elements 40.

First cured silicone resin material 30 contains a coupling agent, and, as silicone that is the principal component, silicone including a hydrocarbon group in a side chain, such as polydimethyl silicone, polydiphenyl silicone, or the like. In addition, a particulate light reflective material may be added to first cured silicone resin material 30. Titanium oxide ($TiO_2$), zinc oxide (ZnO), and the like exemplify the light reflective materials. With this, first cured silicone resin material 30 has electrical insulation and light reflectivity. Since first cured silicone resin material 30 has light reflectivity, light emitted from below and sides of light-emitting elements 40 is reflected by the light reflective material, travels upward, and is emitted from semiconductor device 1.

Light-emitting elements 40 are mounted above mounting substrate 10. Light-emitting elements 40 each are, for example, a solid-state light-emitting element such as a light-emitting diode (LED). As an LED, a blue LED in which a nitride compound semiconductor is formed on a gallium nitride (GaN) substrate is used, for example. In the examples shown in FIG. 1 and FIG. 2, two light-emitting elements 40 are electrically connected in series, and mounted above mounting substrate 10. However, the number of light-emitting elements 40 to be mounted above mounting substrate 10 are not particularly limited. The number of light-emitting elements 40 may be one, and may be three or more.

Light-transmissive members 50 each allow light emitted from light-emitting element 40 to pass through. Each light-transmissive member 50 includes, for example, resin or glass. Each light-transmissive member 50 may contain a phosphor that converts the wavelength of at least part of light emitted from light-emitting element 40. The phosphor is dispersed throughout each light-transmissive member 50.

Second cured silicone resin materials 60 each are disposed between light-emitting element 40 and light-transmissive member 50, and cover side faces of light-emitting element 40. Each second cured silicone resin material 60 may cover side faces of light-transmissive member 50. Each second cured silicone resin material 60 joins light-emitting element 40 and light-transmissive member 50 together. Each second cured silicone resin material 60 contains a coupling agent, and, as silicone that is the principal component, silicone including a hydrocarbon group in a side chain, such as polydimethyl silicone, polydiphenyl silicone, or the like.

Third cured silicone resin material 70 is disposed above mounting substrate 10. In a plan view of mounting substrate 10, third cured silicone resin material 70 is in contact with the outside of first cured silicone resin material 30. Third cured silicone resin material 70 is in contact with mounting substrate 10. Moreover, in a plan view of mounting substrate 10, third cured silicone resin material 70 is disposed in the vicinity of thin cured silicone resin material film 20. Third cured silicone resin material 70 functions as a frame for blocking a flow of silicone resin when first cured silicone resin material 30 is formed. Third cured silicone resin material 70 is, for example, a cured material of UV-curable silicone resin. Third cured silicone resin material 70 may be a cured material of thermosetting silicone resin. Third cured silicone resin material 70 contains a coupling agent, and as silicone that is the principal component, silicone including a hydrocarbon group in a side chain, such as polydimethyl silicone, polydiphenyl silicone, or the like.

Details will be described later, but UV light irradiation can increase the oxygen content of thin cured silicone resin material film 20. For this reason, in the whole region in a thickness direction, the oxygen content per unit volume of a part of thin cured silicone resin material film 20 which is in the vicinity of the reflective member is higher than the oxygen content per unit volume of a part of thin cured silicone resin material film 20 which is farther away from the reflective member than the part in the vicinity of the reflective member in this case. Therefore, in the part in the vicinity of the reflective member, adhesion between thin cured silicone resin material film 20 and first cured silicone resin material 30 can be further increased. The term "UV light" is applied to UV light in a wavelength range in which the thin cured silicone resin material is altered. In addition, third cured silicone resin material 70 may be a reflective member having light reflectivity to UV light. For example, the reflective member is formed by evaporating, for example, metal that reflects UV light onto third cured silicone resin material 70.

Note that, instead of third cured silicone resin material 70, other resin materials, ceramic, or the like may be used to form a frame.

Although silicone resin itself does not typically have an adhesion function of adhering to a base such as mounting substrate 10, the adhesion function can be added by applying and curing silicone resin after the silicone resin is mixed with a trace of a coupling agent. Accordingly, adhesion between a base and silicone resin can be increased. Specifically, when an OH group exists on a surface of a base, such as metal, ceramic, or plastic, to which silicone resin is applied when the silicone resin is applied and cured, the OH group on the surface of the base and an OH group of the coupling agent contained in the silicone resin approach each other. The OH group on the surface of the base and the OH group of the coupling agent which have approached each other dehydrate by application of heat etc., and a covalent bond is formed between the base and the silicone resin. As a result, adhesion between the base and a cured silicone resin material can be increased. Moreover, since the coupling agent and the base are bonded together when curing is performed, the coupling agent localize at an interface between the base and the silicone resin. For this reason, after the curing is performed, the OH group hardly exists on a surface of the cured silicone resin material which is a surface to which the base is not adhered.

Operation and Advantageous Effect

Next, operation and advantageous effects of semiconductor device 1 according to the embodiment will be described.

As has been described above, semiconductor device 1 includes mounting substrate 10, thin cured silicone resin material film 20 that is disposed above and in contact with mounting substrate 10, and first cured silicone resin material 30 that is in contact with thin cured silicone resin material film 20. In semiconductor device 1, an oxygen content per unit volume of thin cured silicone resin material film 20 in the whole region in a thickness direction is higher than an oxygen content per unit volume of first cured silicone resin material 30 in the whole region in the thickness direction.

As has been described above, a cured silicone resin material (e.g., a scattered coating of silicone resin which is formed on a base due to some factor) which is formed using a typical method has a surface on which an OH group hardly exists. Meanwhile, thin cured silicone resin material film 20 according to the embodiment is a thin cured silicone resin material film whose oxygen content has been increased as a result of oxidizing only a hydrocarbon group in a side chain of silicone by, for example, irradiating the above-mentioned scattered coating with ultraviolet rays (UV light), without damaging a macroscopic structure of the silicone. For example, since binding energy of a Si—C bond (337 kJ/mol, equivalent to 3.48 eV) is smaller than photon energy of 254 nm UV light (4.88 eV) often used in low pressure mercury lamps, a photochemical reaction can occur. In contrast, since binding energy of a C—H bond (409 kJ/mol) and binding energy of a Si—O bond (444 kJ/mol) are larger than photon energy of the UV light, a photochemical reaction does not occur. Therefore, an oxygen content is increased as a result of oxidizing only a hydrocarbon group in a side chain of silicone. In other words, the OH group is likely to exist on the surface of thin cured silicone resin material film 20 which is a surface to which mounting substrate 10 is not adhered. As described above, when first cured silicone resin material 30 is applied to and formed on thin cured silicone resin material film 20 whose oxygen content per unit volume is higher than an oxygen content per unit volume of first cured silicone resin material 30, bonding via a coupling agent etc. contained in silicone resin before first cured silicone resin material 30 is cured is readily formed. For this reason, adhesion between thin cured silicone resin material film 20 and first cured silicone resin material 30 is increased. Therefore, semiconductor device 1 can prevent separation of first cured silicone resin material 30 that covers members of semiconductor device 1, such as mounting substrate 10.

In addition, semiconductor device 1 includes light-emitting elements 40 mounted above mounting substrate 10, and light-transmissive members 50 disposed above light-emitting elements 40. Moreover, semiconductor device 1 includes second cured silicone resin materials 60 each of which is disposed between light-emitting element 40 and light-transmissive member 50, and covers at least one of side faces of light-emitting element 40 and side faces of light-transmissive member 50. In a plan view of mounting substrate 10, thin cured silicone resin material film 20 is disposed around and in the vicinity of the side faces of light-emitting elements 40.

As described above, adhesion between thin cured silicone resin material film 20 and first cured silicone resin material 30 is increased. With this, in a plan view of mounting substrate 10, separation of first cured silicone resin material 30 is prevented even around and in the vicinity of the side faces of light-emitting elements 40 where separation is likely to occur due to, for example, heat generated by light-emitting elements 40.

[Manufacturing Method]

Next, with reference to FIG. 3 through FIG. 15, a manufacturing method for manufacturing semiconductor devices 1 according to Embodiment 1 will be described.

Figure 3:
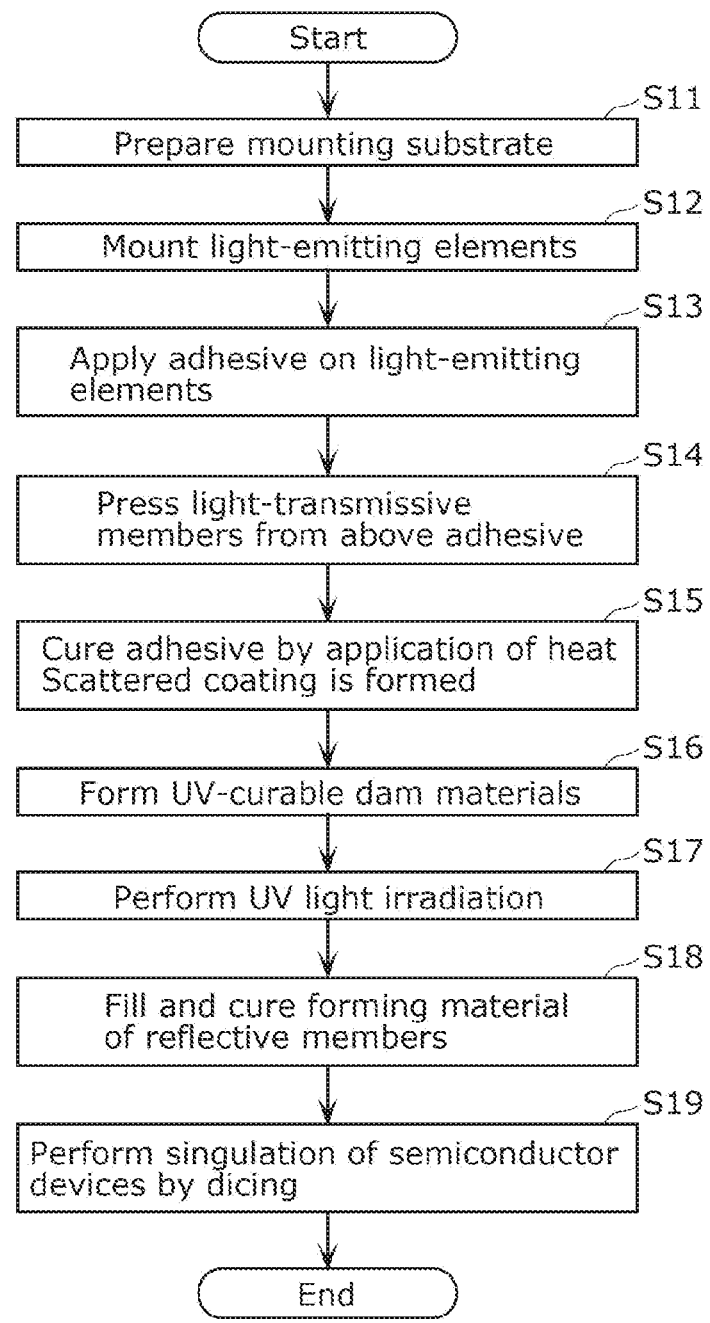
FIG. 3 is a flowchart illustrating a manufacturing method for manufacturing the semiconductor devices according to Embodiment 1.

FIG. 3 is a flowchart illustrating a manufacturing method for manufacturing semiconductor devices 1 according to Embodiment 1.

Figure 4:
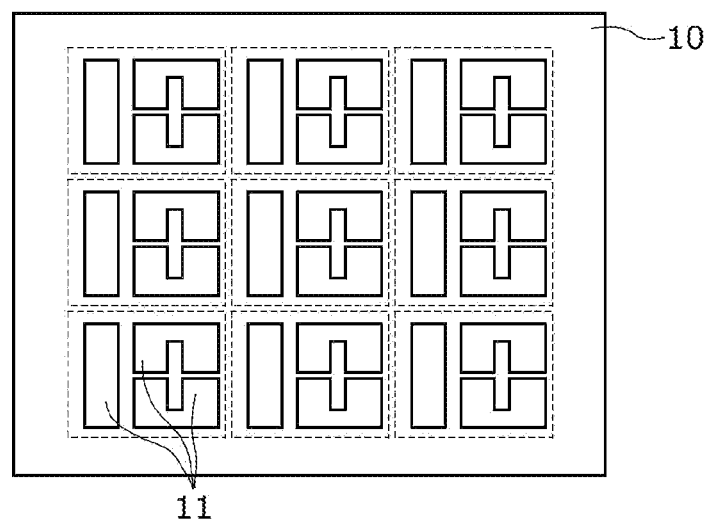
FIG. 4 is a top view for illustrating a process of preparing a mounting substrate in manufacturing processes of manufacturing the semiconductor devices according to Embodiment 1.

First, mounting substrate 10 (submount) on which conductive patterns 11 are formed is prepared (S11 in FIG. 3). As mounting substrate 10, a sintered AlN substrate is used, for example. FIG. 4 is a top view for illustrating a process of preparing mounting substrate 10 in manufacturing processes of manufacturing semiconductor devices 1.

As illustrated in FIG. 4, conductive patterns 11 are formed on mounting substrate 10 in a three-by-three matrix. Although an illustration is omitted, conductive patterns 11 are electrically connected with a connecting terminal on the back surface, and can supply electric power to light-emitting elements 40 connected to conductive patterns 11. Mounting substrate 10 is divided into shapes bounded by the dotted lines shown in FIG. 4 by dicing mounting substrate 10 afterward. In the example shown in FIG. 4, nine semiconductor devices 1 are manufactured from one mounting substrate 10. Note that mounting substrate 10 need not be divided. One semiconductor device 1 may be manufactured from one mounting substrate 10, and one mounting substrate 10 may be divided into a number other than nine.

Moreover, when a large number of light-emitting elements 40 are used for one semiconductor device 1, a conductive pattern may be appropriately formed such that light-emitting elements 40 can be connected in series or in parallel to each other using flip-chip connection. For example, although each conductive pattern 11 illustrated in FIG. 4 is a pattern for connecting two light-emitting elements 40 in series, the shape of metal pads may be designed such that conductive pattern 11 can be connected to the p-type electrodes and the n-type electrodes of light-emitting elements 40 using bump connection. Note that although actual conductive patterns 11 on mounting substrate 10 have a complicated shape to conform to the electrode pattern of light-emitting elements 40, the illustration of conductive patterns 11 are simplified in FIG. 4.

Figure 5:
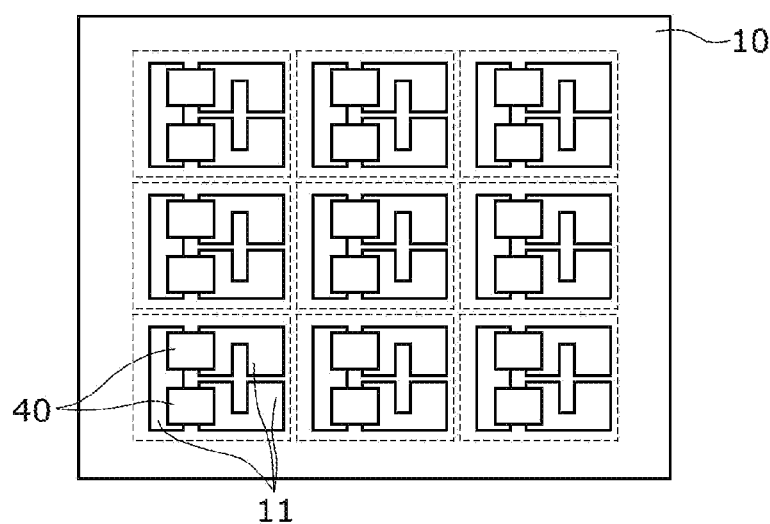
FIG. 5 is a top view for illustrating a process of mounting light-emitting elements in the manufacturing processes of manufacturing the semiconductor devices according to Embodiment 1.

Next, light-emitting elements 40 are mounted on mounting substrate 10 (S12 of FIG. 3). FIG. 5 is a top view for illustrating a process of mounting light-emitting elements 40 in the manufacturing processes of manufacturing semiconductor devices 1.

As light-emitting elements 40 to be mounted, blue LED chips in each of which a nitride compound semiconductor is formed on a GaN substrate are used. For example, several metal bumps are placed on each of metal pads, light-emitting elements 40 are placed above mounting substrate 10 using a flip-chip method with the growth substrate sides of light-emitting elements 40 up, and light-emitting elements 40 and mounting substrate 10 are welded by ultrasonic welding. For example, light-emitting elements 40 each have a height of 100 μm and a width of 1 mm, and are placed on the metal bumps each having a height of 20 μm. As illustrated in FIG. 5, two light-emitting elements 40 are mounted for each of diced mounting substrates 10.

Note that the growth substrates each may have a micro textured structure by roughening the back surface (the top face in terms of mounted light-emitting element 40). In order to roughen the back surface of the growth substrate, minute irregularities are formed by, etching, blasting, laser or dicing blade machining, etc. When the growth substrate that is sapphire or the like and has a refractive index lower than the refractive index of GaN is used as a base material, the back surface of the growth substrate may be flat.

Next, light-transmissive members 50 are adhered to the top faces of light-emitting elements 40.

Figure 6:
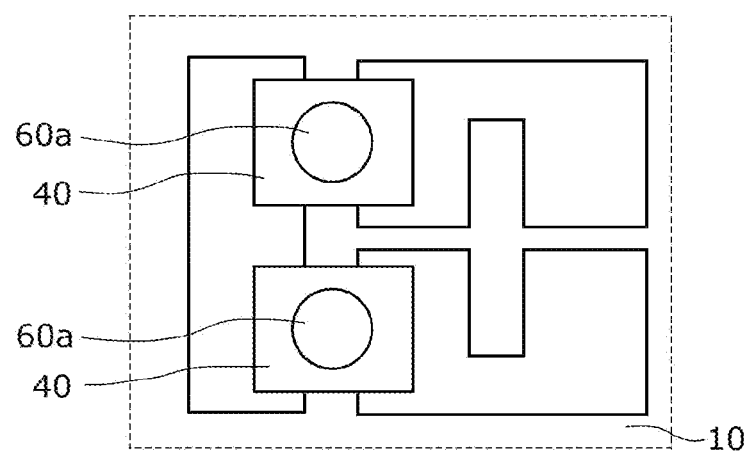
FIG. 6 is a top view for illustrating a process of applying adhesive in the manufacturing processes of manufacturing the semiconductor devices according to Embodiment 1.

First, adhesive 60a is applied on each light-emitting element 40 (S13 in FIG. 3). Details will be described later, but second cured silicone resin material 60 is formed by curing adhesive 60a. FIG. 6 is a top view for illustrating a process of applying adhesive 60a in the manufacturing processes of manufacturing semiconductor devices 1. FIG. 6 illustrates one section (section for one semiconductor device 1 after dicing is performed) out of sections bounded by the dotted lines shown in FIG. 4 and FIG. 5. As illustrated in FIG. 6, on the centers of the back surfaces (top faces) of growth substrates of light-emitting elements 40, a predetermined amount of light-transmissive resin is applied as adhesive 60a using a dispenser. Adhesive 60a is, for example, liquid silicone resin. The silicone resin is, for example, thermosetting silicone resin, and may be UV-curable silicone resin. The principal component of the silicone resin is, for example, polydimethyl silicone, but may be polydiphenyl silicone, modified polysilicone, or the like. Moreover, in order to increase adhesion between light-emitting elements 40 and light-transmissive members 50, the silicone resin may contain a coupling agent. Note that although a dispensing method is used for the application of adhesive 60a, other application methods, such as a stamp method, may be used.

Next, light-transmissive members 50 are pressed from above adhesive 60a (S14 in FIG. 3). FIG. 7, FIG. 8A, FIG. 8B, and FIG. 8C are examples of cross-sectional views for illustrating a process of pressing light-transmissive member 50 from above adhesive 60a in the manufacturing processes of manufacturing semiconductor devices 1. FIG. 7, FIG. 8A, FIG. 8B, and FIG. 8C each illustrate one section (section for one semiconductor device 1 after dicing is performed) out of sections bounded by the dotted lines shown in FIG. 4 and FIG. 5. FIG. 8B and FIG. 8C illustrate, as other examples of light-transmissive member 50, light-transmissive member 50a and light-transmissive member 50b each having a size different from the size of light-transmissive member 50 in FIG. 8A.

Figure 7:
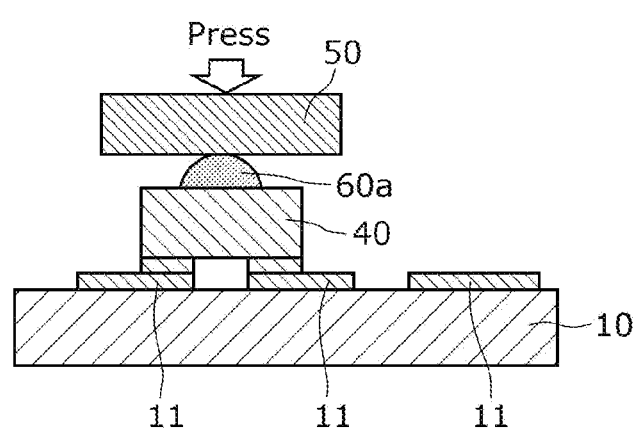
FIG. 7 is a cross-sectional view for illustrating a process of pressing a light-transmissive member from above the adhesive in the manufacturing processes of manufacturing the semiconductor devices according to Embodiment 1.
Figure 8A:
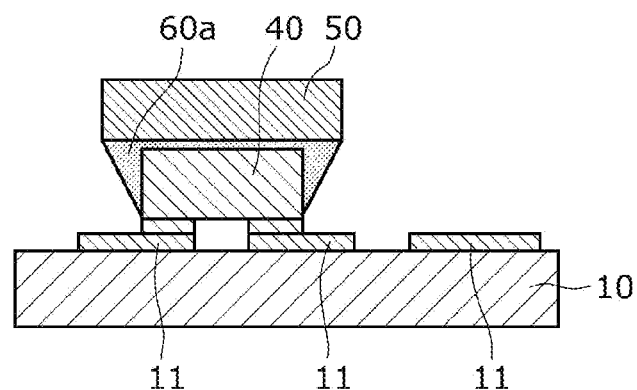
FIG. 8A is another cross-sectional view for illustrating the process of pressing the light-transmissive member from above the adhesive in the manufacturing processes of manufacturing the semiconductor devices according to Embodiment 1.
Figure 8B:
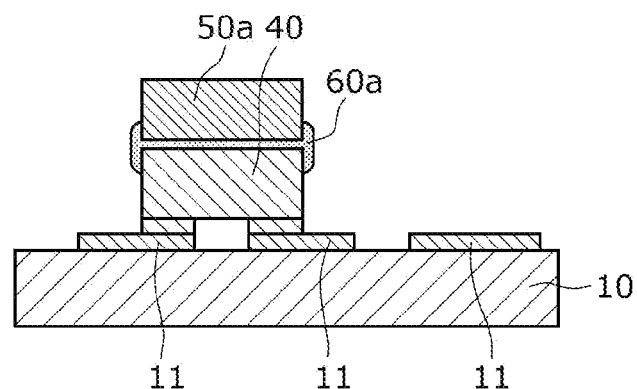
FIG. 8B is another cross-sectional view for illustrating the process of pressing the light-transmissive member from above the adhesive in the manufacturing processes of manufacturing the semiconductor devices according to Embodiment 1.
Figure 8C:
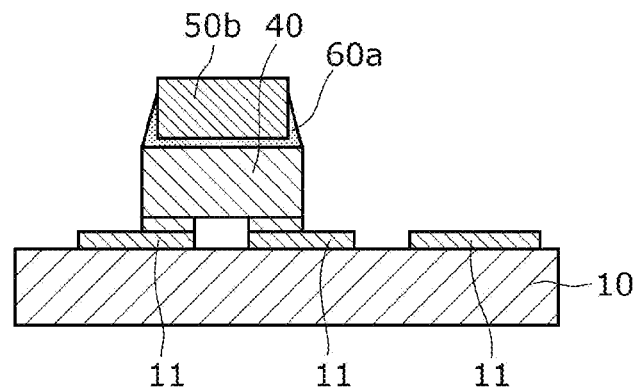
FIG. 8C is another cross-sectional view for illustrating the process of pressing the light-transmissive member from above the adhesive in the manufacturing processes of manufacturing the semiconductor devices according to Embodiment 1.

As illustrated in FIG. 7, light-transmissive member 50 is placed on adhesive 60a, and is pressed from above. With this, adhesive 60a is spread by force and covers the whole top face of light-emitting element 40. In a plan view of mounting substrate 10, light-transmissive member 50 is placed such that the center of light-transmissive member 50 coincides with the center of light-emitting element 40. Here, a reduction in a gap between light-emitting element 40 and light-transmissive member 50 pushes out adhesive 60a to the side faces of light-emitting element 40 from the adhesive surface between light-emitting element 40 and light-transmissive member 50 as illustrated in FIG. 8A, and adhesive 60a covers the side faces of light-emitting element 40. Moreover, FIG. 8B and FIG. 8C illustrate cases in which adhesive 60a is pressed, from above, by light-transmissive member 50a and light-transmissive member 50b each having a size different from the size of light-transmissive member 50 illustrated in FIG. 8A in a plan view of mounting substrate 10.

According to size relationships between light-emitting element 40 and each of light-transmissive members 50, 50a, 50b, adhesive 60a has shapes as illustrated in FIG. 8A, FIG. 8B, and FIG. 8C. As illustrated in FIG. 8A, when the size of light-emitting element 40 is smaller than the size of light-transmissive member 50 in a plan view of mounting substrate 10, adhesive 60a covers the side faces of light-emitting element 40. As illustrated in FIG. 8B, when the size of light-emitting element 40 is nearly equal to the size of light-transmissive member 50a in a plan view of mounting substrate 10, adhesive 60a covers the side faces of both light-emitting element 40 and light-transmissive member 50a. As illustrated in FIG. 8C, when the size of light-emitting element 40 is larger than the size of light-transmissive member 50b in a plan view of mounting substrate 10, adhesive 60a covers the side faces of light-emitting element 50b. As described above, the shape of a pushed-out part of adhesive 60a changes depending on the size of a light-transmissive member, and adhesive 60a covers at least one of side faces of light-emitting element 40 and side faces of a light-transmissive member.

Figure 9A:
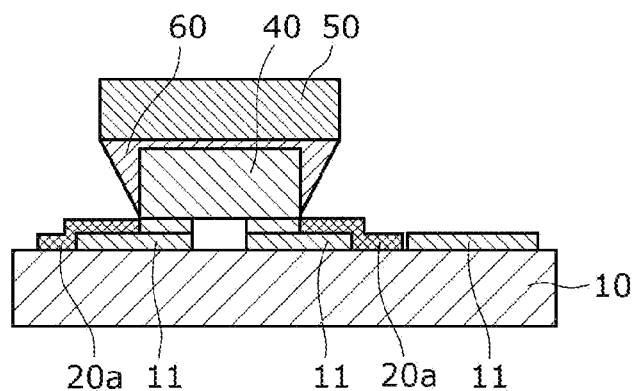
FIG. 9A is a cross-sectional view for illustrating a process of curing the adhesive in the manufacturing processes of manufacturing the semiconductor devices according to Embodiment 1.
Figure 9B:
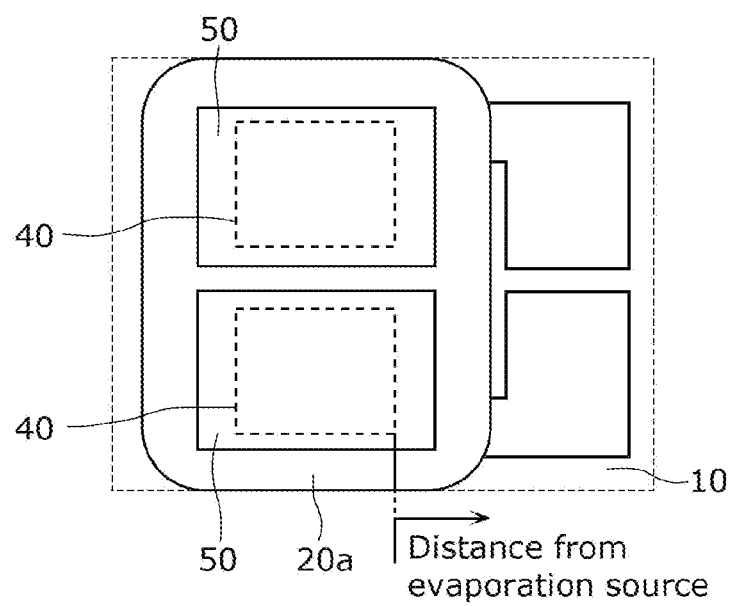
FIG. 9B is a top view for illustrating the process of curing the adhesive in the manufacturing processes of manufacturing the semiconductor devices according to Embodiment 1.

Thereafter, mounting substrate 10 above which adhesive 60a is pressed by light-transmissive member 50 is heated in an oven set to 150° C. for approximately three hours to cure adhesive 60a. Moreover, during curing, scattered coating 20a is formed on mounting substrate 10 around light-emitting element 40 in a plan view (S15 in FIG. 3). Details will be described later, but thin cured silicone resin material film 20 is formed by altering scattered coating 20a. FIG. 9A is a cross-sectional view for illustrating a process of curing adhesive 60a in the manufacturing processes of manufacturing semiconductor devices 1. FIG. 9B is a top view for illustrating the process of curing adhesive 60a in the manufacturing processes of manufacturing semiconductor devices 1.

As illustrated in FIG. 9A and FIG. 9B, application of heat during the curing causes low-molecular silicone and a coupling agent contained in silicone resin (liquid) to evaporate from adhesive 60a due to high vapor pressure. Accordingly, the low-molecular silicone and the coupling agent scatter around and in the vicinity of light-emitting elements 40 in a plan view of mounting substrate 10. As a result, as a coating of a cured silicone resin material including the low-molecular silicone and the coupling agent, scattered coating 20a is formed above and in contact with mounting substrate 10. In addition, adhesive 60a is cured by application of heat, and second cured silicone resin materials 60 are formed from adhesive 60a.

Figure 10:
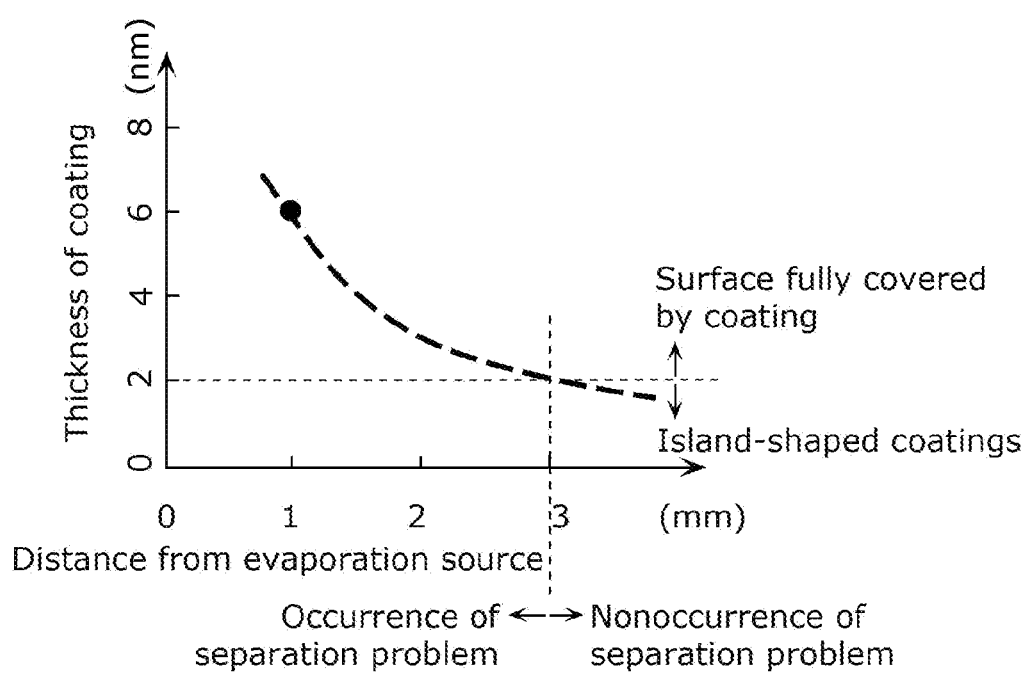
FIG. 10 is a diagram illustrating one example of relationships between distances from silicone resin and thicknesses of a scattered coating formed.

FIG. 10 is a diagram illustrating one example of relationships between distances from silicone resin (evaporation source) and thicknesses of scattered coating 20a formed. The distances from the evaporation source (adhesive 60a) shown in FIG. 10 are distances from a side face of light-emitting element 40 in a plan view of mounting substrate 10 as illustrated in FIG. 9B. FIG. 10 illustrates thicknesses of scattered coating 20a resulting from thermal curing performed on adhesive 60a applied at a height of from 20 μm to 120 μm from mounting substrate 10 at a temperature of 150° C. for three hours. Thicknesses of scattered coating 20a are measured by repeating measurement using TOF-SIMS and sputtering of about 1 nm in thickness using sputtering ions, and analyzing positions at which fragment ions derived from scattered coating 20a are detected. A thickness of thin cured silicone resin material film 20 can also be measured using the same method.

As illustrated in FIG. 10, the thickness of scattered coating 20a on mounting substrate 10 at a position 1 mm from the evaporation source is, for example, 6 nm. Typically, when the evaporation source scatters to a side, a thickness of scattered coating 20a is approximately inversely proportional to a distance. Accordingly, a thickness of scattered coating 20a to be formed is greater when a distance from the evaporation source is shorter. For this reason, as denoted by the dotted line shown in FIG. 10, the thickness of scattered coating 20a may monotonously decrease as a distance from a side face of light-emitting element 40 increases, for example.

When a cured silicone resin material is further formed above mounting substrate 10 on which scattered coating 20a is formed, the cured silicone resin material is likely to be separated from above mounting substrate 10 at a position where the distance from light-emitting element 40 is up to about 3 mm. Specifically, at a position where the distance from light-emitting element 40 is less than or equal to 3 mm, scattered coating 20a is seamlessly formed on mounting substrate 10. Accordingly, the likelihood that the cured silicone resin material is separated is thought to be the same as the likelihood that the cured silicone resin material is separated from a typical cured silicone resin material. Meanwhile, a thickness of scattered coating 20a at a position where the distance from light-emitting element 40 is 3 mm is estimated to be 2 nm. When a thickness of scattered coating 20a is less than or equal to 2 nm, scattered coating 20a only partially covers mounting substrate 10 (i.e., covers mounting substrate 10 in island shapes). Accordingly, a part of the cured silicone resin material can be directly adhered to mounting substrate 10, and thus it can be thought that the cured silicone resin material is unlikely to be separated.

Next, UV-curable dam materials 70a are formed on mounting substrate 10 so as to entirely surround light-emitting elements 40 in a plan view (S16 in FIG. 3). Dam materials 70a each become, in a later process, a frame for preventing a forming material of a reflective member that covers the side faces and the bottom faces of light-emitting elements 40 from draining. Details will be described later, but each third cured silicone resin material 70 is formed by curing dam material 70a.

Figure 11:
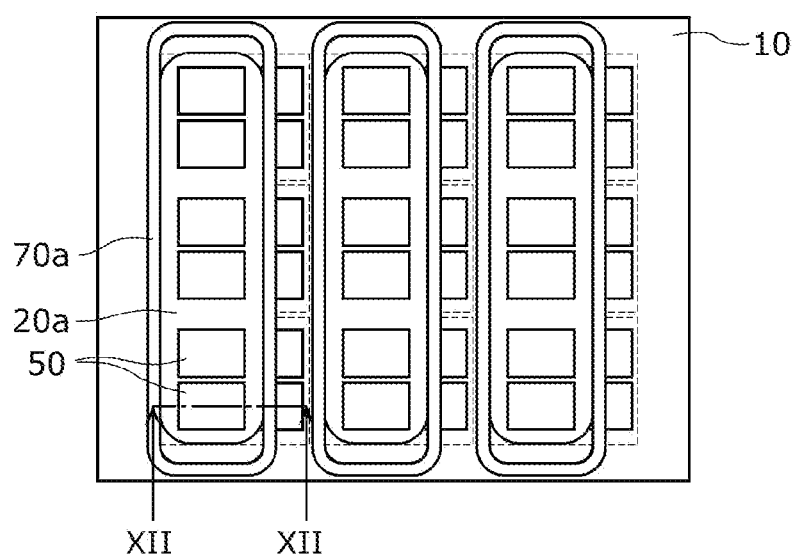
FIG. 11 is a top view for illustrating a process of forming dam materials in the manufacturing processes of manufacturing the semiconductor devices according to Embodiment 1.
Figure 12:
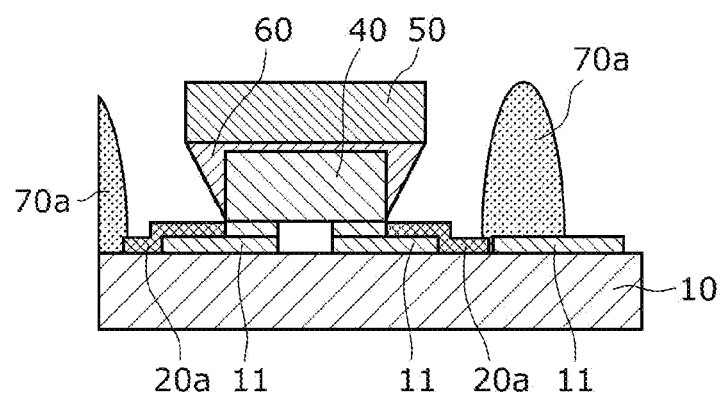
FIG. 12 is a cross-sectional view of FIG. 11 taken along line XII-XII.

FIG. 11 is a top view for illustrating a process of forming dam materials 70a in the manufacturing processes of manufacturing semiconductor device 1. FIG. 12 is a cross-sectional view of FIG. 11 taken along line XII-XII. As illustrated in FIG. 11 and FIG. 12, each dam material 70a is formed by being applied on mounting substrate 10 using a dispensing method so as to surround several light-emitting elements 40. Three dam materials 70a are formed such that each dam material 70a surrounds several light-emitting elements 40 aligned in a longitudinal direction; however, the shape surrounding light-emitting elements 40 is not limited. Dam material 70a may be formed so as to surround (i) two light-emitting elements 40 included in one semiconductor device after dicing, (ii) several light-emitting elements 40 aligned in a lateral direction, and (iii) all of light-emitting elements 40 disposed above mounting substrate 10. Moreover, in a plan view of mounting substrate 10, dam materials 70a may be overlapped with the top face of scattered coating 20a, or may be disposed apart from the top face of scattered coating 20a.

Here, as a structural requirement for dam materials 70a, a forming material of dam materials 70a having high viscosity is suitable; however, when the viscosity is too high, a discharge of the forming material from an application nozzle becomes difficult. For this reason, the viscosity of the forming material of dam materials 70a may be adjusted to a degree that the forming material would not lose its shape after application like toothpaste, for example. Specifically, the viscosity of the forming material may be adjusted to viscosity of about from 100 Pa·s to 200 Pa·s.

For example, the forming material of dam materials 70a is applied using a dispensing method such that the forming material is applied in a narrow line having a width of about 200 μm. The above-mentioned narrow line is formed when the application is performed under the following conditions: (i) the inside diameter of an application nozzle is φ250 μm, (ii) an ambient temperature during the application is 30° C., (iii) the viscosity of the forming material at 30° C. is about 200 Pa·s, and (iv) the application speed is 2.8 mm/s.

The forming material of dam materials 70a in this embodiment is UV-curable silicone resin, but the forming material may be thermosetting silicone resin. A case in which the forming material of dam materials 70a is thermosetting silicone resin will be described later.

Next, UV light irradiation is performed from above mounting substrate 10 (S17 in FIG. 3). Accordingly, mounting substrate 10 above which scattered coating 20a and line-shaped dam materials 70a are formed as illustrated in FIG. 11 and FIG. 12 is irradiated with UV light, and an alteration in scattered coating 20a, and UV curing of the paste-like forming material of dam materials 70a are simultaneously performed. Specifically, in an alteration in scattered coating 20a, dimethyl silicone is oxidized, and some methyl groups in side chains of the dimethyl silicone are replaced by OH groups. Irradiation with UV light forms thin cured silicone resin material film 20 from scattered coating 20a. Moreover, irradiation with UV light forms, in a later process, third cured silicone resin materials 70 each of which functions as a frame for preventing a forming material of a reflective member from draining. A lamp used for the UV curing is, for example a low-pressure mercury lamp, but may be other lamps that emit UV light, such as a high-pressure mercury lamp.

For example, in the process of performing UV light irradiation, a low-pressure mercury lamp is used to emit an integrated amount of UV light of 3000 mJ/cm$^2$ in a temperature of 50° C. for 3 minutes in an air atmosphere. Conditions for the UV light irradiation are not limited to the above-described conditions. For example, UV light used for UV light irradiation may be an integrated amount of UV light of from 1000 mJ/cm$^2$ to 5000 mJ/cm$^2$. In cases where thin cured silicone resin material films 20 are formed from scattered coatings 20a by performing irradiation with integrated amounts of UV light of 1000 mJ/cm$^2$, 3000 mJ/cm$^2$, and 5000 mJ/cm$^2$, every case has produced an effect of improving adhesion to first cured silicone resin material 30 (reflective member) which will be formed afterward. An oxygen content per unit volume of each of thin cured silicone resin material films 20 formed by performing irradiation with UV light as described above will be described later.

Here, the surface of mounting substrate 10 which is in contact with thin cured silicone resin material film 20 may have light reflectivity to UV light. With this, UV light that has passed through scattered coating 20a or thin cured silicone resin material film 20 is reflected off the surface of mounting substrate 10, and scattered coating 20a or thin cured silicone resin material film 20 is irradiated again with UV light. Accordingly, an effect of the alteration can be enhanced. For example, in a mounting substrate having a surface including gold, aluminum, copper, or the like, the surface has reflectivity of at least 30% to UV light.

In addition, the thickness of thin cured silicone resin material film 20 to be formed may be less than or equal to 0.1 µm, or may be less than or equal to 0.01 µm. When the thickness of thin cured silicone resin material film 20 is small as described above, oxygen in air which is necessary for an oxidation reaction caused by UV irradiation is supplied throughout the whole region of thin cured silicone resin material film 20 in the thickness direction. For this reason, in the whole region in the thickness direction, an oxygen content per unit volume of thin cured silicone resin material film 20 is readily increased. Moreover, when the thickness of thin cured silicone resin material film 20 is small, gas produced by water molecules etc. formed within thin cured silicone resin material film 20 may pass through thin cured silicone resin material film 20 and may be released outside. When a location in which an OH group of a coupling agent of thin cured silicone resin material film 20 and an OH group of mounting substrate 10 form a hydrogen bond exists, a dehydration reaction is caused by UV irradiation and a covalent bond is formed. For this reason, adhesion between thin cured silicone resin material film 20 and mounting substrate 10 is further increased. Consequently, release of water molecules formed by a dehydration reaction to the outside further speeds up the dehydration reaction, and adhesion between thin cured silicone resin material film 20 and mounting substrate 10 is increased.

In addition, as described above, the thickness of scattered coating 20a may monotonously decrease as a distance from a side face of light-emitting element 40 increases. For this reason, the thickness of thin cured resin material film 20 formed from scattered coating 20a may monotonously decrease as a distance from a side face of light-emitting element 40 increases. When the thickness of thin cured silicone resin material film 20 is small due to the foregoing reasons, a region in which thin cured silicone resin material film 20 is discontinuous also exists. For this reason, a junction between mounting substrate 10 and first cured silicone resin material 30 (e.g., junction via a coupling agent) coexists with a junction between thin cured silicone resin material film 20 and first cured silicone resin material 30. Accordingly, separation of first cured silicone resin material 30 is further prevented.

In addition, UV light irradiation reduces the thickness of scattered coating 20a. For example, the thickness of thin cured silicone resin material film 20 at a distance 1 mm from a side face of light-emitting element 40 is 4 nm.

Moreover, as described above, dam material 70a is UV-curable silicone resin. For this reason, each third cured silicone resin material 70 to be formed from dam material 70a is a cured material of UV-curable silicone resin. Accordingly, irradiation with an amount of UV light sufficient for an alteration in scattered coating 20a is performed when third cured silicone resin materials 70 are formed, and thus an oxygen content of thin cured silicone resin material film 20 formed from scattered coating 20a can be increased. In addition, since UV-curable silicone resin does not require a process of heating and cooling during curing, time for manufacturing semiconductor devices 1 is reduced, and thus productivity of semiconductor devices 1 is increased.

Moreover, third cured silicone resin materials 70 (dam material 70a) may be light-transmissive to UV light. Specifically, third cured silicone resin materials 70 (dam material 70a) may have transmittance of at least 50% to UV light having a wavelength of 254 nm. For example, third cured silicone resin materials 70 include a material not including a UV absorbing material such as titanium oxide. With this, in a plan view of mounting substrate 10, scattered coating 20a disposed in a region in which scattered coating 20a and third cured silicone resin materials 70 overlap is also irradiated with UV light. Accordingly, an oxygen content of thin cured silicone resin material film 20 to be formed from scattered coating 20a can be increased.

Figure 13:
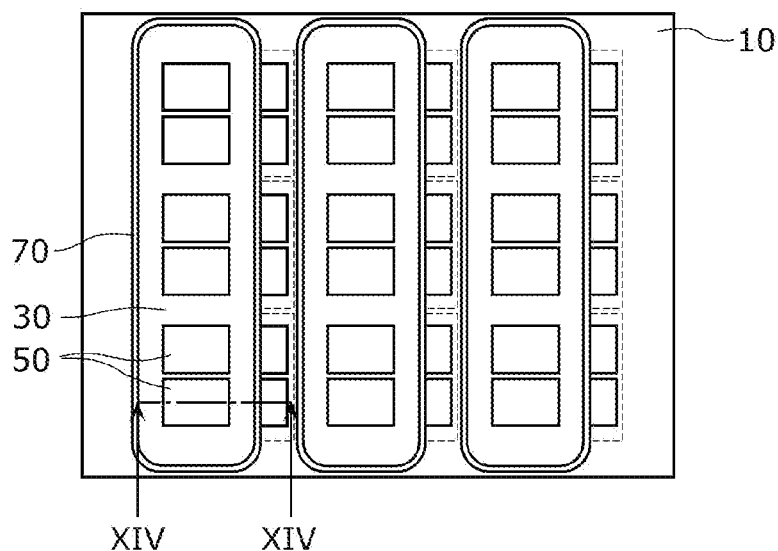
FIG. 13 is a top view for illustrating a process of filling and curing a forming material of reflective members in the manufacturing processes of manufacturing the semiconductor devices according to Embodiment 1.
Figure 14:
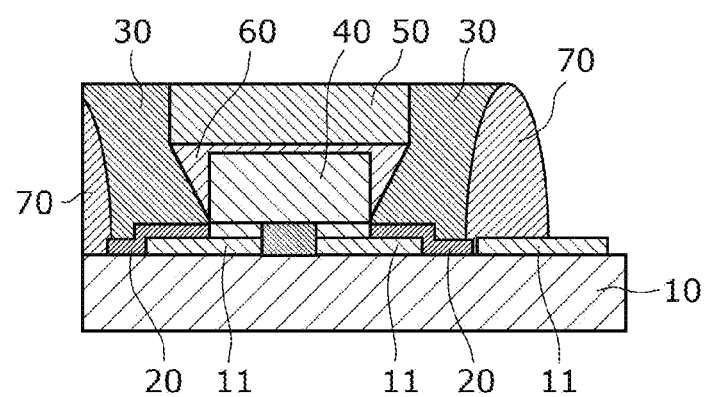
FIG. 14 is a cross-sectional view of FIG. 13 taken along line XIV-XIV.

Next, a forming material of reflective members is filled between light-emitting elements 40 and each third cured silicone resin material 70 that functions as a frame, and is cured (S18 in FIG. 3). FIG. 13 is a top view for illustrating a process of filling and curing a forming material of the reflective members in the manufacturing processes of manufacturing semiconductor devices 1. FIG. 14 is a cross-sectional view of FIG. 13 taken along line XIV-XIV.

After dam materials 70a are cured and third cured silicone resin materials 70 are formed, a forming material of the reflective members is introduced (filled) between light-emitting elements 40 and each third cured silicone resin material 70. As the forming material of the reflective members, silicone resin in which, as a light reflective material, titanium oxide particles are dispersed throughout thermosetting dimethyl silicone resin having low viscosity of about 20 Pa·s is used, for example.

The forming material of the reflective members which has low viscosity is distributed throughout a gap between light-emitting elements 40 and each third cured silicone resin material 70. After the forming material of the reflective members flattens, mounting substrate 10 is heated in an oven to cure the forming material of the reflective members. The forming material of the reflective members is cured at 150° C. for three hours, for example. With this, first cured silicone resin materials 30 are formed as the reflective members.

As illustrated in FIG. 13 and FIG. 14, first cured silicone resin materials 30 are formed in regions above mounting substrate 10 above which light-emitting elements 40 are mounted, such that each first cured silicone resin material 30 surrounds the bottom faces and side faces of light-emitting elements 40, side faces of second cured silicone resin materials 60, and side faces of light-transmissive members 50.

The forming material of the reflective members is not limited to liquid silicone resin. The forming material may be a light-transmissive liquid medium having low viscosity throughout which granular light reflective materials are dispersed. The light-transmissive liquid medium includes, as the main material, glass or resin, such as epoxy resin, acrylic resin, polyimide resin, urea resin, or fluorocarbon resin. The light reflective material is not limited to titanium oxide particles. The light reflective material may be, for example, zinc oxide particles. Reflective members, such as first cured silicone resin materials 30, can be formed by curing liquid resin containing a light reflective material and a dispersant of the light reflective material.

Note that first cured silicone resin materials 30 need not be reflective members containing a light reflective material. First cured silicone resin materials 30 may be, for example, sealing members not containing a light reflective material.

Figure 15:
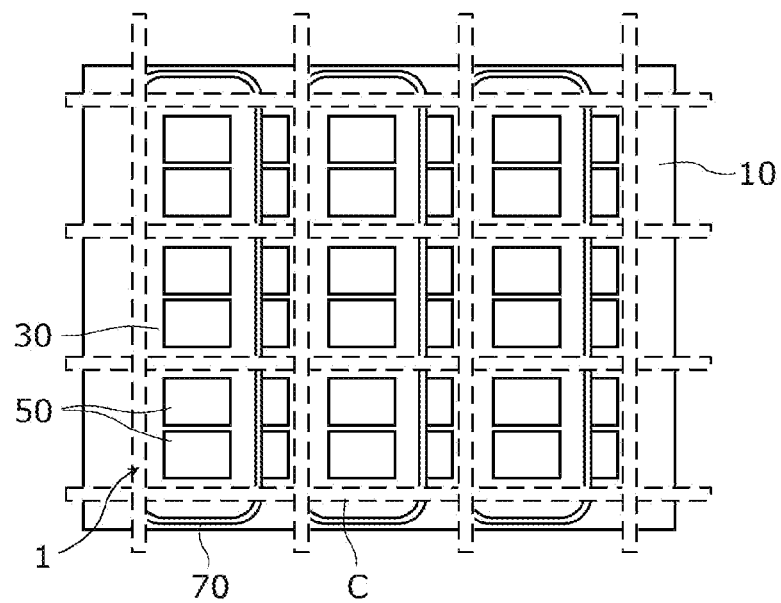
FIG. 15 is a top view for illustrating a process of performing singulation of the semiconductor devices in the manufacturing processes of manufacturing the semiconductor devices according to Embodiment 1.

Lastly, singulation of semiconductor devices 1 is performed by dicing (S19 in FIG. 3). FIG. 15 is a top view for illustrating a process of performing singulation of semiconductor devices 1 in the manufacturing processes of manufacturing semiconductor devices 1. As illustrated in FIG. 15, one mounting substrate 10 above which several semiconductor devices 1 are arranged in a matrix is diced (divided), and singulation into individual semiconductor devices 1 is performed. In the dicing, singulation of semiconductor devices 1 is performed using, for example, a rotary grindstone (dicing blade). Dotted line portions C shown in FIG. 15 are locations to be cut. When a hard mounting substrate 10 including AlN or the like is to be cut, a dicing blade having a width of about from 100 μm to 150 μm is used, for example. As a result of the singulation, semiconductor device 1 as illustrated in FIG. 1 and FIG. 2 is obtained.

Test Example 1

Next, test example 1 of semiconductor device 1 according to Embodiment 1 will be described. In this test example, semiconductor device 1 is manufactured using the above-described manufacturing method. In step S17 of the above-described manufacturing method shown in FIG. 3, scattered coating 20a is irradiated with UV light under the following conditions: (i) the use of a low-pressure mercury lamp, (ii) irradiation with an integrated amount of light of 3000 $mJ/cm^2$, (iii) irradiation in air, (iv) irradiation in an ambient temperature of 50° C., and (v) irradiation for 3 minutes. Thereafter, TOF-SIMS analysis was performed on thin cured silicone resin material film 20 and first cured silicone resin material 30 of manufactured semiconductor device 1 at a position where the distance from light-emitting element 40 in a plan view of mounting substrate 10 is 1 mm (thickness is 6 nm). Specifically, at the position where the distance from light-emitting element 40 in a plan view of mounting substrate 10 is 1 mm, a portion of the upper part of first cured silicone resin material 30 was chipped off in the first place. Next, in a direction from first cured silicone resin material 30 toward thin cured silicone resin material film 20 (thickness direction of thin cured silicone resin material film 20), measurement using TOF-SIMS and sputtering of about 1 nm in thickness using sputtering ions were repeated. As described above, fragment ions were measured several times in the thickness direction. In order to compare measurement results, a detection amount of fragment ions for each of fragment ion types was standardized. In other words, by standardizing, each detection amount indicates a detection amount of fragment ions per unit volume. Then, for each of first cured silicone resin material 30 and thin cured silicone resin material film 20, several standardized measurement results (measurement results obtained by measurement carried out by sputtering in the thickness direction for several times) were averaged for each fragment ion type to indicate detection amounts of fragment ions of first cured silicone resin material 30 and thin cured silicone resin material film 20.

Figure 16:
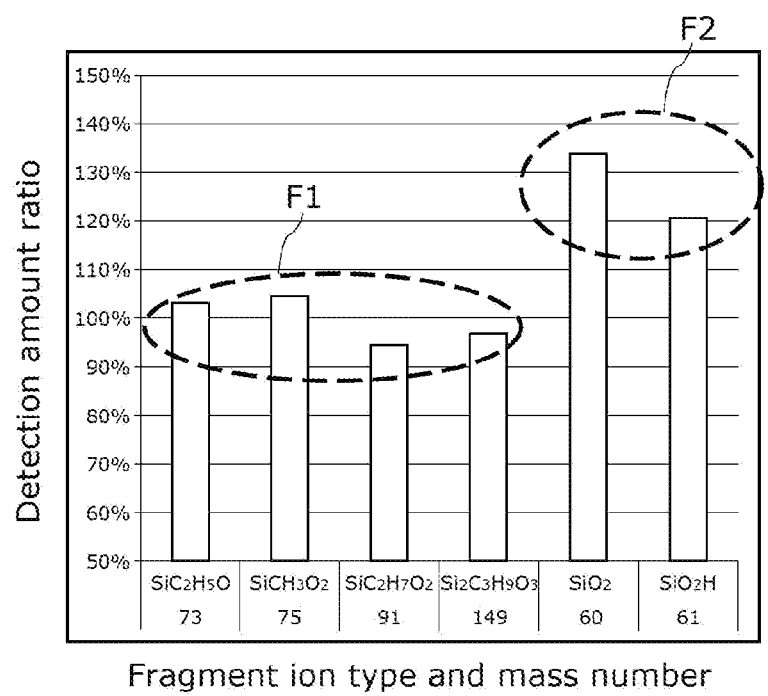
FIG. 16 is a diagram illustrating detection amounts of fragment ions of a thin cured silicone resin material film according to Embodiment 1.

FIG. 16 is a diagram illustrating detection amounts of fragment ions of thin cured silicone resin material film 20. Detection amount ratios indicated along the vertical axis shown in FIG. 16 are values calculated for each fragment ion type by the following equation: detection amount ratio=detection amount in thin cured silicone resin material film 20/detection amount in first cured silicone resin material 30. Moreover, FIG. 16 shows, as detected fragment ions, $SiC_2H_5O$, $SiCH_3O_2$, $SiC_2H_7O_2$, $Si_2C_3H_9O_3$, $SiO_2$, and $SiO_2H$ ions. Among the above, $SiC_2H_5O$, $SiCH_3O_2$, $SiC_2H_7O_2$, $Si_2C_3H_9O_3$ ions are Si—C—H—O-based fragment ions, and are dimethyl silicone skeleton-derived fragment ions. In addition, $SiO_2$ and $SiO_2H$ ions are $SiO_2$-based fragment ions whose detection amounts increase as an oxygen content of silicone resin increases. For this reason, an average value of detection amounts of the $SiO_2$-based fragment ions in this specification indicates an oxygen content. Note that the oxygen content may be an oxygen content measured using a method other than TOF-SIMS.

As illustrated in FIG. 16, detection amount ratios F1 of the Si—C—H—O-based fragment ions are more than or equal to 90% and less than 110%, and are almost 100% (approximately 1.0 times) when values of the Si—C—H—O-based fragment ions are averaged. Therefore, per unit volume, a detection amount in thin cured silicone resin material film 20 and a detection amount in first cured silicone resin material 30 are almost the same. In contrast, detection amount ratios F2 of $SiO_2$-based fragment ions are 128% (approximately 1.3 times) when values of the $SiO_2$-based fragment ions are averaged. Therefore, per unit volume, a detection amount in thin cured silicone resin material film 20 is greater than a detection amount in first cured silicone resin material 30. Specifically, the inventors have obtained a result that, in the whole region in a thickness direction, an oxygen content per unit volume of thin cured silicone resin material film 20 is higher than an oxygen content per unit volume of first cured silicone resin material 30.

Moreover, a detection amount in thin cured silicone resin material film 20 is greater than a detection amount in first cured silicone resin material 30, not only in the average of detection amounts in each of thickness positions, but also in every detection amount in the thickness positions.

Test Example 2

Next, test example 2 of semiconductor device 1 according to Embodiment 1 will be described. In this test example, among the conditions for UV light irradiation performed in step S17 for manufacturing semiconductor device 1 in test example 1, irradiation with integrated amounts of light of 1000 mJ/cm$^2$, 3000 mJ/cm$^2$, and 5000 mJ/cm$^2$ were respectively performed to manufacture semiconductor devices 1. In addition, in step S17, a semiconductor device including scattered coating 20a on which no UV light irradiation is performed (i.e., an integrated amount of light is 0 mJ/cm$^2$ in step S17) was also manufactured. Adhesion tests for adhesion between thin cured silicone resin material film 20 (scattered coating 20a for the case in which an integrated amount of light is 0 mJ/cm$^2$) and first cured silicone resin material 30 were carried out on the obtained semiconductor devices. The adhesion tests were carried out under the stress conditions of 0.5 MPa and 2.0 MPa. Moreover, analyses carried out using TOF-SIMS in test example 1 were also carried out on the semiconductor device manufactured under the condition in which an integrated amount of light is 0 mJ/cm$^2$.

As results of the adhesion tests carried out on the semiconductor device manufactured without performing UV light irradiation on scattered coating 20a, separation between scattered coating 20a and first cured silicone resin material 30 had occurred at an interface between scattered coating 20a and first cured silicone resin material 30 under both of the stress conditions of 0.5 MPa and 2.0 MPa. Meanwhile, in any of the semiconductor devices manufactured by performing irradiation with integrated amounts of UV light of 1000 mJ/cm$^2$, 3000 mJ/cm$^2$, and 5000 mJ/cm$^2$, the separation did not occur under the stress condition of 0.5 MPa. Moreover, under the stress condition of 2.0 MPa, cohesive failure in which first cured silicone resin material 30 internally ruptures had occurred in all of the semiconductor devices, while a part of first cured silicone resin material 30 is joined to thin cured silicone resin material film 20. As has been described above, the inventors have obtained a result that the separation is prevented by UV light irradiation performed on scattered coating 20a and formation of thin cured silicone resin material film 20.

Figure 17:
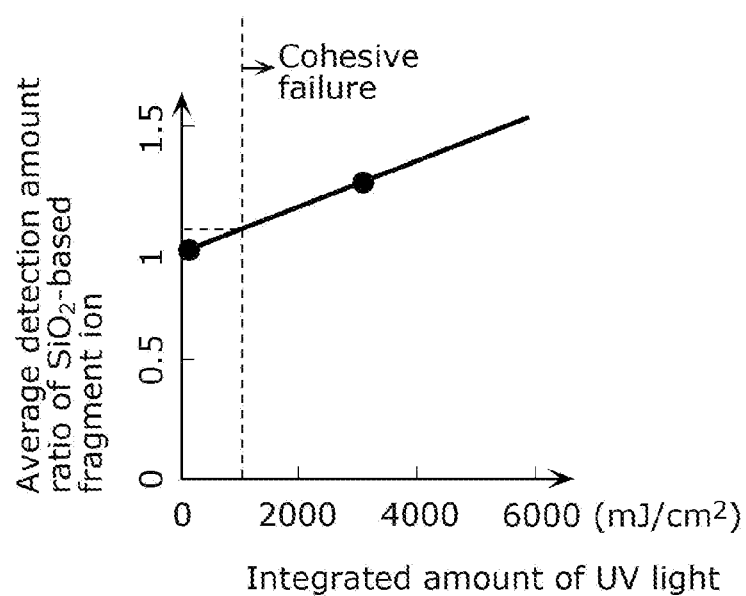
FIG. 17 is a diagram illustrating relationships between integrated amounts of UV light and detection amount ratios of $SiO_2$-based fragment ions.

FIG. 17 is a diagram illustrating relationships between integrated amounts of UV light and detection amount ratios of SiO$_2$-based fragment ions, based on the detection amount ratios of the fragment ions illustrated in FIG. 16. The vertical axis in FIG. 17 represents detection amount ratios of SiO$_2$-based fragment ions of thin cured silicone resin material film 20 or scattered coating 20a which were measured using the method described in test example 1. The horizontal axis in FIG. 17 represents integrated amounts of UV light irradiation performed in step S17. Supposing that a detection amount ratio of SiO$_2$-based fragment ions linearly increases with respect to an integrated amount of light, it can be estimated that adhesion strength increases when detection amount ratio is 1.1 times or greater, since a separation mode shifts to cohesive failure when the integrated amount of light is 1000 mJ/cm$^2$ as described above. In other words, in the whole region in a thickness direction, an oxygen content per unit volume of thin cured silicone resin material film 20 may be at least 1.1 times an oxygen content per unit volume of first cured silicone resin material 30. Thin cured silicone resin material film 20 as described above has a surface on which a large number of OH groups that increase adhesion exits, and thus adhesion strength between thin cured silicone resin material film 20 and first cured silicone resin material 30 increases. In view of further increasing the adhesion, an oxygen content per unit volume of thin cured silicone resin material film 20 in the whole region in a thickness direction may be at least 1.25 times an oxygen content per unit volume of first cured silicone resin material 30 in the whole region in the thickness direction.

Moreover, in view of preventing a decrease in intensity of thin cured silicone resin material film 20, an oxygen content per unit volume of thin cured silicone resin material film 20 in the whole region in a thickness direction may be at most 1.8 times an oxygen content per unit volume of first cured silicone resin material 30 in the whole region in the thickness direction.

In addition, a change in the thickness of thin cured silicone resin material film 20 had not changed the results of the adhesion tests, and a clear correlation between a thickness of thin cured silicone resin material film 20 and an increase in adhesion intensity was not observed.

Embodiment 2

Next, a semiconductor device according to Embodiment 2 will be described. Note that the following Embodiment 2 mainly describes differences from Embodiment 1, and thus descriptions of common points are omitted or simplified.

Figure 18:
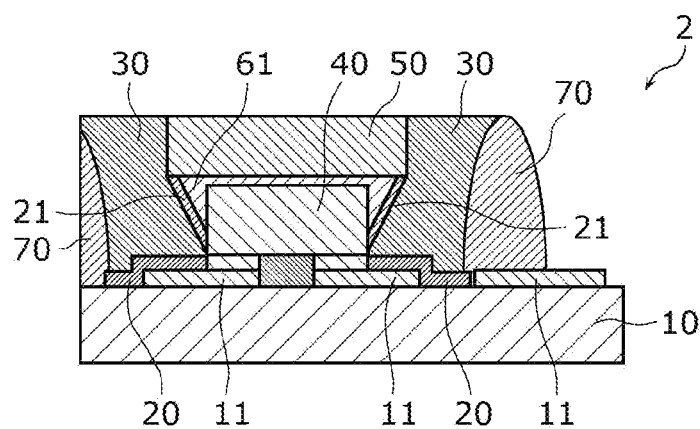
FIG. 18 is a cross-sectional view illustrating a configuration of a semiconductor device according to Embodiment 2.

FIG. 18 is a cross-sectional view illustrating a configuration of semiconductor device 2 according to Embodiment 2. In comparison with semiconductor device 1 according to Embodiment 1, semiconductor device 2 is different in that semiconductor device 2 includes second cured silicone resin materials 61 instead of second cured silicone resin materials 60, and thin cured silicone resin material film 21 that is in contact with second cured silicone resin materials 61.

As illustrated in FIG. 18, semiconductor device 2 includes mounting substrate 10, thin cured silicone resin material films 20 and 21, first cured silicone resin material 30, light-emitting elements 40, light-transmissive members 50, second cured silicone resin materials 61, and third cured silicone resin material 70.

Thin cured silicone resin material films 21 each are in contact with second cured silicone resin material 61 and first cured silicone resin material 30, and cover the outer periphery of second cured silicone resin material 61. Thin cured silicone resin material film 21 is disposed between second cured silicone resin material 61 and first cured silicone resin material 30, and joins second cured silicone resin material 61 and first cured silicone resin material 30 together. Thin cured silicone resin material film 21 includes, in the same manner as thin cured silicone resin material film 20, a coupling agent, and silicone in which OH groups are formed, for example. In the whole region in a thickness direction, an oxygen content per unit volume of thin cured silicone resin material film 21 is higher than an oxygen content per unit volume of first cured silicone resin material 30.

Second cured silicone resin materials 61 each are disposed between light-emitting element 40 and light-transmissive member 50, and cover side faces of light-emitting element 40. In this embodiment, second cured silicone resin material 61 is one example of a base. Second cured silicone resin material 61 may cover at least one of side faces of light-emitting element 40 and side faces of light-transmissive member 50. Second cured silicone resin material 61 has a part that extends to the side faces from between light-emitting element 40 and light-transmissive member 50. Second cured silicone resin material 61 is in contact with thin cured silicone resin material film 21 in the part of second cured silicone resin material 61 which extends to the side faces from between light-emitting element 40 and light-transmissive member 50.

The resin structure of second cured silicone resin materials 61 is substantially the same as the resin structure of thin cured silicone resin material films 21. In this embodiment, substantially the same resin structure means that the resin structures have substantially the same standardized detection amount of each of the Si—C—H—O-based fragment ions that derive from the main skeleton of a cured silicone resin material among the fragment ions detected using TOF-SIMS. For example, for each Si—C—H—O-based fragment ion, a ratio of a detection amount in second cured silicone resin material 61 to a detection amount in thin cured silicone resin material film 21 is more than or equal to 90% and less than 110%, like the detection amount ratios of the fragment ions illustrated in FIG. 16.

Figure 19:
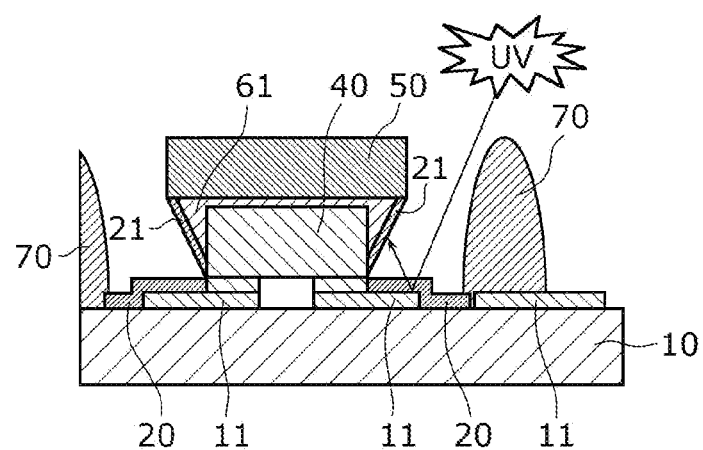
FIG. 19 is a cross-sectional view for illustrating a process of performing UV light irradiation in manufacturing processes of manufacturing the semiconductor devices according to Embodiment 2.

Next, a manufacturing method for manufacturing semiconductor device 2 will be described. Semiconductor device 2 is manufactured using, in the manufacturing method for manufacturing semiconductor device 1, mounting substrate 10 having light reflectivity to UV light, for example. FIG. 19 is a cross-sectional view for illustrating a process of performing UV light irradiation in manufacturing processes of manufacturing semiconductor devices 2. FIG. 19 illustrates, in step S17 of the manufacturing processes shown in FIG. 3, a case in which mounting substrate 10 whose surface on the first cured silicone resin material 30 side (in other words, the top face of mounting substrate 10) has light reflectivity to UV light is used. First cured silicone resin material 30 will be formed later. As illustrated in FIG. 19, UV light is reflected off the top surface of mounting substrate 10, and surfaces of second cured silicone resin materials 60 (see FIG. 12) are irradiated with UV light. With this, the vicinity of the surfaces of second cured silicone resin materials 60 alters. As a result, second cured silicone resin materials 61 and thin cured silicone resin material films 21 are formed from second cured silicone resin materials 60. As described above, semiconductor device 2 including thin cured silicone resin material films 21 that are in contact with the side faces of second cured silicone resin materials 61 can be obtained. As described above, since the top face of mounting substrate 10 has light reflectivity to UV light, parts that are shadowed by direct UV light are effectively irradiated with UV light. Accordingly, an oxygen content of each thin cured silicone resin material film 21 can be increased.

Note that mounting substrate 10 need not have light reflectivity to UV light; second cured silicone resin materials 60 may be irradiated with UV light by, for example, adjusting the position of a lamp.

As has been described above, semiconductor device 2 includes second cured silicone resin materials 61, thin cured silicone resin material films 21 that are in contact with second cured silicone resin materials 61, and first cured silicone resin material 30 that is in contact with thin cured silicone resin material films 21. In the whole region in a thickness direction, an oxygen content per unit volume of each thin cured silicone resin material film 21 is higher than an oxygen content per unit volume of first cured silicone resin material 30. In semiconductor device 2, second cured silicone resin materials 61 are cured materials of silicone resin, and the resin structure of second cured silicone resin materials 61 is substantially the same as the resin structure of thin cured silicone resin material films 21.

As described above, an oxygen content per unit volume of each thin cured silicone resin material film 21 that is in contact with second cured silicone resin material 61 is higher than an oxygen content per unit volume of first cured silicone resin material 30. Thin cured silicone resin material films 21 as described above can achieve the same effect as thin cured silicone resin material films 20 according to Embodiment 1, and have high adhesion to first cured silicone resin material 30. Moreover, since the resin structure of second cured silicone resin materials 61 is substantially the same as the resin structure of thin cured silicone resin material films 21, thin cured silicone resin material films 21 do not have a fragile structure even though thin cured silicone resin material films 21 each contain a high oxygen content, and maintain mechanical strength. For this reason, thin cured silicone resin material films 21 are unlikely to be damaged. Therefore, semiconductor device 2 can prevent separation of first cured silicone resin material 30.

In addition, semiconductor device 2 further includes mounting substrate 10, light-emitting elements 40 mounted above mounting substrate 10, and light-transmissive members 50 disposed above light-emitting elements 40. Second cured silicone resin materials 61 each are disposed between light-emitting element 40 and light-transmissive member 50, and cover the side faces of light-emitting element 40. First cured silicone resin material 30 is disposed above mounting substrate 10.

With this, second cured silicone resin materials 61 covering the side faces of light-emitting elements 40 and first cured silicone resin material 30 are joined together via thin cured silicone resin material films 21. As described above, adhesion between thin cured silicone resin material films 21 and first cured silicone resin material 30 is high. For this reason, separation between thin cured silicone resin material films 21 that are in contact with second cured silicone resin materials 61 covering the side faces of light-emitting elements 40 and first cured silicone resin material 30 is prevented.

Embodiment 3

Next, a semiconductor device according to Embodiment 3 will be described. Note that the following Embodiment 3 mainly describes differences from Embodiment 1, and thus descriptions of common points are omitted or simplified.

Figure 20:
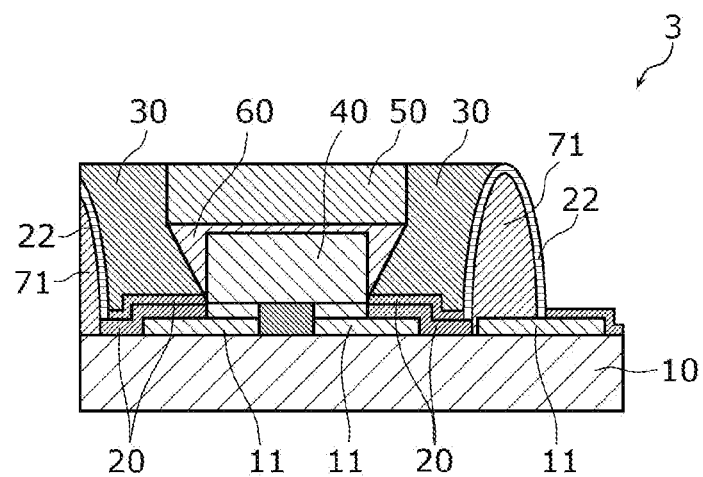
FIG. 20 is a cross-sectional view illustrating a configuration of a semiconductor device according to Embodiment 3.

FIG. 20 is a cross-sectional view illustrating a configuration of semiconductor device 3 according to Embodiment 3. In comparison with semiconductor device 1 according to Embodiment 1, semiconductor device 3 is different in that semiconductor device 3 includes third cured silicone resin material 71 instead of third cured silicone resin material 70, and thin cured silicone resin material film 22 that is in contact with third cured silicone resin material 71.

As illustrated in FIG. 20, semiconductor device 3 includes mounting substrate 10, thin cured silicone resin material films 20 and 22, first cured silicone resin material 30, light-emitting elements 40, light-transmissive members 50, second cured silicone resin materials 60, and third cured silicone resin material 71.

Thin cured silicone resin material film 22 is in contact with third cured silicone resin material 71 and first cured silicone resin material 30. Thin cured silicone resin material film 22 covers third cured silicone resin material 71. Thin cured silicone resin material film 22 is disposed between third cured silicone resin material 71 and first cured silicone resin material 30, and joins third cured silicone resin material 71 and first cured silicone resin material 30 together. Thin cured silicone resin material film 22 includes, in the same manner as thin cured silicone resin material film 20, a coupling agent, and silicone in which OH groups are formed, for example. In the whole region in a thickness direction, an oxygen content per unit volume of thin cured silicone resin material film 22 is higher than an oxygen content per unit volume of first cured silicone resin material 30.

First cured silicone resin material 30 is disposed in a region surrounded by third cured silicone resin material 71, mounting substrate 10, and light-emitting elements 40.

Third cured silicone resin material 71 is disposed above mounting substrate 10 and outside light-emitting elements 40, as at least a part of a frame surrounding light-emitting elements 40 in a plan view of mounting substrate 10. In this embodiment, third cured silicone resin material 71 is one example of a base.

The resin structure of third cured silicone resin material 71 is substantially the same as the resin structure of thin cured silicone resin material film 22. For example, for each of the Si—C—H—O-based fragment ions, a ratio of a detection amount in third cured silicone resin material 71 to a detection amount in thin cured silicone resin material film 22 is more than or equal to 90% and less than 110%, like the detection amount ratios of the fragment ions illustrated in FIG. 16.

Figure 21:
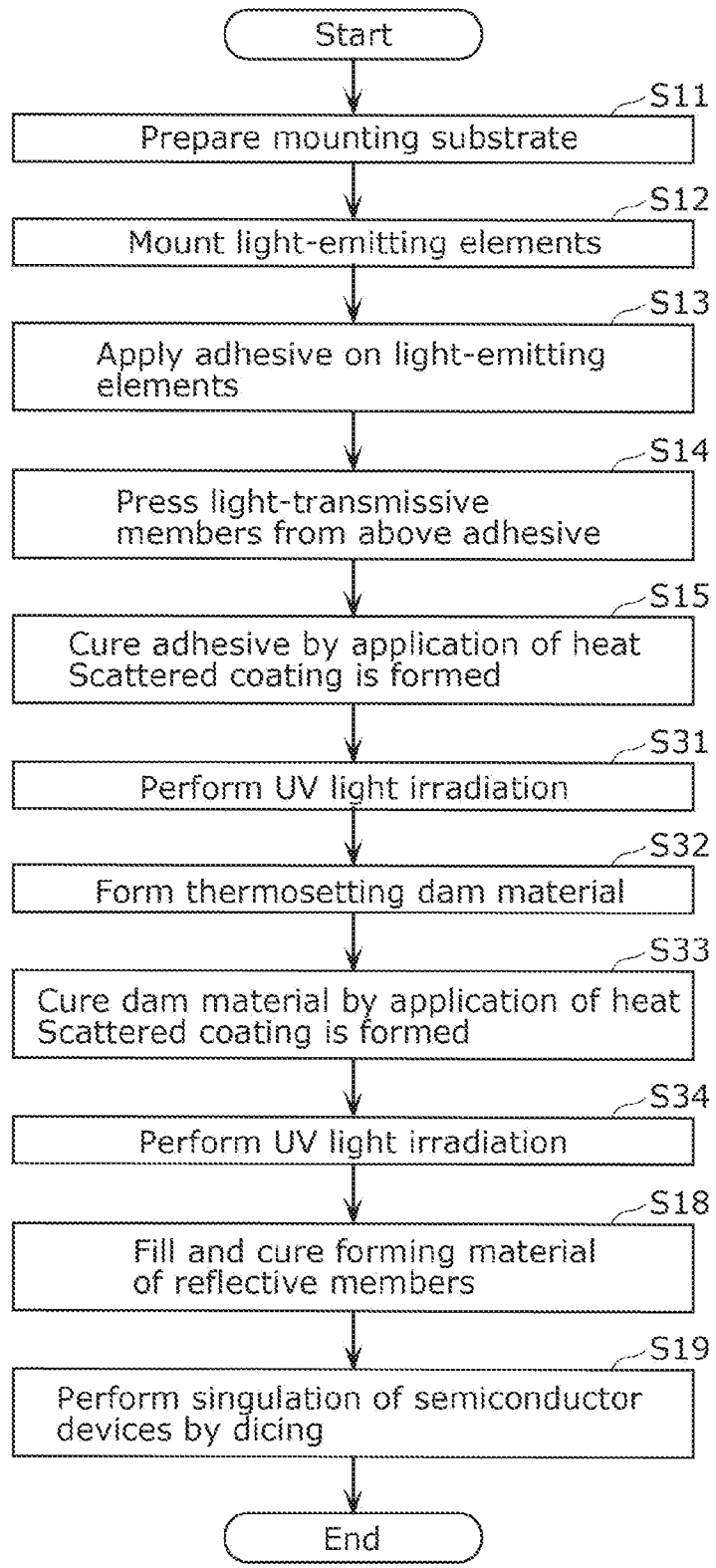
FIG. 21 is a flowchart illustrating a manufacturing method for manufacturing the semiconductor devices according to Embodiment 3.

Next, a manufacturing method for manufacturing semiconductor device 3 will be described. FIG. 21 is a flowchart illustrating a manufacturing method for manufacturing semiconductor devices 3 according to Embodiment 3.

As illustrated in FIG. 21, step S11 through step S15 are the same as step S11 through step S15 of the manufacturing method for manufacturing semiconductor devices 1 according to Embodiment 1, and thus descriptions of the foregoing steps are omitted. Owing to the processes up to step S15, scattered coating 20a is formed around light-emitting elements 40 in a plan view of mounting substrate 10, as illustrated in FIG. 9A and FIG. 9B.

Figure 22:
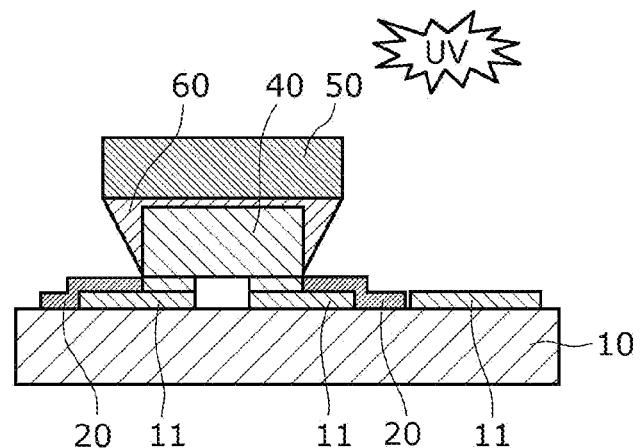
FIG. 22 is a cross-sectional view for illustrating a process of performing first UV light irradiation in manufacturing processes of manufacturing the semiconductor devices according to Embodiment 3.

Next, UV light irradiation is performed from above mounting substrate 10 (S31 in FIG. 21). FIG. 22 is a cross-sectional view for illustrating a process of performing first UV light irradiation in manufacturing processes of manufacturing semiconductor devices 3. As illustrated in FIG. 22, mounting substrate 10 on which scattered coating 20a is formed is irradiated with UV light to alter scattered coating 20a. With this, thin cured silicone resin material film 20 is formed from scattered coating 20a. Since conditions for UV light irradiation, etc., are the same as those described in step S17 shown in FIG. 3, descriptions of the foregoing are omitted.

Figure 23:
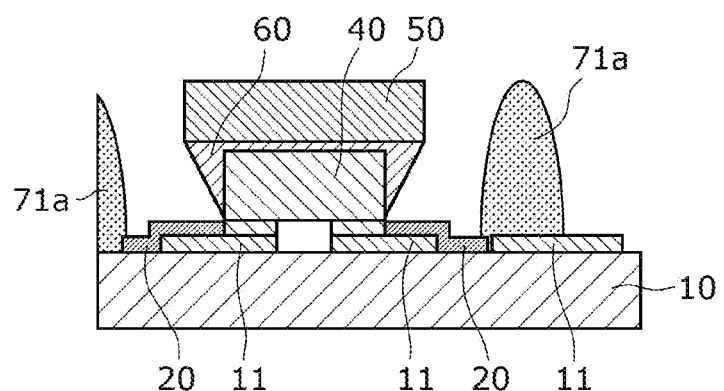
FIG. 23 is a cross-sectional view for illustrating a process of forming a dam material in the manufacturing processes of manufacturing the semiconductor devices according to Embodiment 3.

Next, thermosetting dam materials 71a are formed on mounting substrate 10 so as to entirely surround light-emitting elements 40 in a plan view (S32 in FIG. 21). FIG. 23 is a cross-sectional view for illustrating a process of forming dam material 71a in the manufacturing processes of manufacturing semiconductor devices 3. As illustrated in FIG. 23, dam material 71a is formed by being applied on mounting substrate 10 using a dispensing method so as to surround light-emitting elements 40. A forming material of dam material 71a is thermosetting silicone resin. Since a structural requirement for dam material 71a, a shape to be formed, an application method for applying the forming material of dam material 71a, etc. are the same as those of dam material 70a described in step S16 in FIG. 3, descriptions of the foregoing are omitted.

Figure 24:
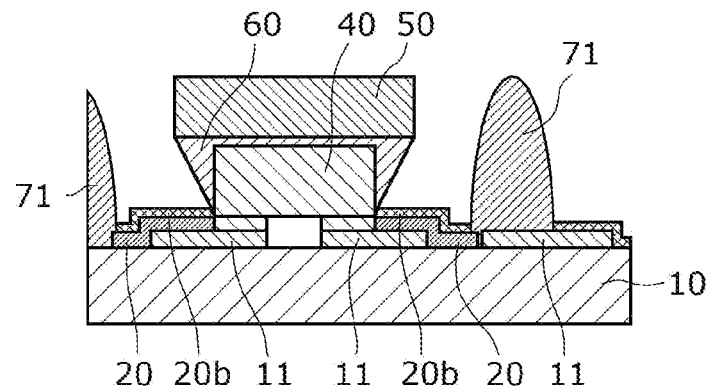
FIG. 24 is a cross-sectional view for illustrating a process of curing the dam material in the manufacturing processes of manufacturing the semiconductor devices according to Embodiment 3.

Next, mounting substrate 10 on which dam materials 71a are formed is heated to cure dam materials 71a. Moreover, during the curing, scattered coatings 20b are formed around dam materials 71a on mounting substrate 10 in a plan view of mounting substrate 10 (S33 in FIG. 21). FIG. 24 is a cross-sectional view for illustrating a process of curing dam material 71a in the manufacturing processes of manufacturing semiconductor devices 3. Due to application of heat during the curing, low-molecular silicone and a coupling agent included in silicone resin (liquid) evaporate from dam material 71a due to high vapor pressure, and the low-molecular silicone and the coupling agent scatter around and in the vicinity of dam material 71a in a plan view of mounting substrate 10. As a result, as illustrated in FIG. 24, scattered coating 20b is formed above mounting substrate 10, and above and in contact with thin cured silicone resin material film 20. Since UV light irradiation performed in step S31 causes thin cured silicone resin material film 20 having a high oxygen content to be formed from scattered coating 20b, adhesion between thin cured silicone resin material film 20 and scattered coating 20b is high. For this reason, thin cured silicone resin material film 20 and scattered coating 20b are unlikely to be separated.

In addition, dam material 71a is cured by application of heat, and third cured silicone resin material 71 is formed. The application of heat during the curing is performed for about three hours at a temperature about 50° C. higher than a temperature at which the forming material of dam material 71a is gelled.

Figure 25:
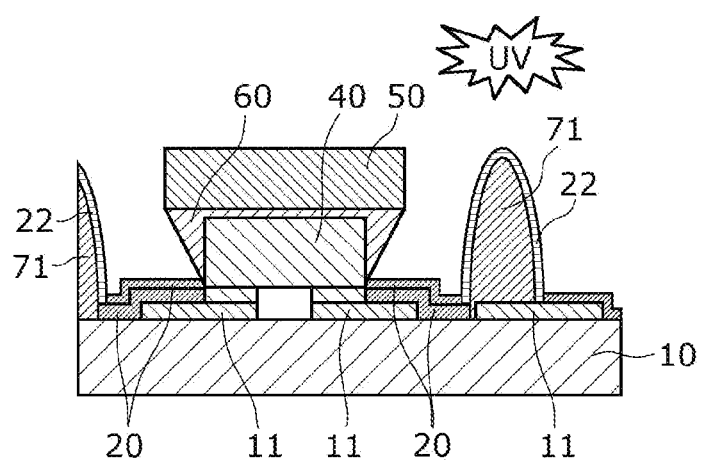
FIG. 25 is a cross-sectional view for illustrating a process of performing second UV light irradiation in the manufacturing processes of manufacturing the semiconductor devices according to Embodiment 3.

Next, UV light irradiation is performed again from above mounting substrate 10 (S34 in FIG. 21). FIG. 25 is a cross-sectional view for illustrating a process of performing second UV light irradiation in the manufacturing processes of manufacturing semiconductor devices 3. As illustrated in FIG. 25, mounting substrate 10 above which scattered coating 20b is formed is irradiated with UV light to alter scattered coating 20b. With this, thin cured silicone resin material film 20 is formed from scattered coating 20b. Moreover, UV light irradiation performed as well on a surface of third cured silicone resin material 71 causes the vicinity of the surface of third cured silicone resin material 71 to alter, and thus thin cured silicone resin material film 22 is formed. Since conditions for UV light irradiation, etc., are the same as those described in step S17 in FIG. 3, descriptions of the foregoing are omitted.

Thereafter, a forming material of reflective members is filled and then cured to form first cured silicone resin materials 30, and singulation of semiconductor devices 3 is performed by dicing (S18 and S19 in FIG. 21). Since these processes are the same as the above-described steps S18 and S19 in FIG. 3, descriptions of the foregoing are omitted. As described above, mounting substrate 10 on which several semiconductor devices 3 arranged in a matrix is diced, and singulation into semiconductor devices 3 is performed. Accordingly, semiconductor device 3 illustrated in FIG. 20 is obtained.

As has been described above, semiconductor device 3 includes third cured silicone resin material 71, thin cured silicone resin material film 22 that is in contact with third cured silicone resin material 71, and first cured silicone resin material 30 that is in contact with thin cured silicone resin material film 22. In the whole region in a thickness direction, an oxygen content per unit volume of thin cured silicone resin material film 22 is higher than an oxygen content per unit volume of first cured silicone resin material 30. In semiconductor device 3, third cured silicone resin material 71 is a cured material of silicone resin, and the resin structure of third cured silicone resin material 71 is substantially the same as the resin structure of thin cured silicone resin material film 22.

Since thin cured silicone resin material film 22 as described above can achieve the same effect as thin cured silicone resin material film 21 according to Embodiment 2, semiconductor device 3 can prevent separation of first cured silicone resin material 30.

Moreover, semiconductor device 3 further includes mounting substrate 10 and light-emitting elements 40 mounted above mounting substrate 10. Third cured silicone resin material 71 is disposed above mounting substrate 10 and outside light-emitting elements 40, as at least a part of a frame surrounding light-emitting elements 40. First cured silicone resin material 30 is disposed in a region surrounded by third cured silicone resin material 71, mounting substrate 10, and light-emitting elements 40.

With this, third cured silicone resin material 71 disposed as a frame for surrounding light-emitting elements 40 and first cured silicone resin material 30 are joined together via thin cured silicone resin material film 22. As described above, adhesion between thin cured silicone resin material film 22 and first cured silicone resin material 30 is high. For this reason, separation between third cured silicone resin material 71 that is disposed so as to surround light-emitting elements 40 and first cured silicone resin material 30 is prevented.

Other Embodiments

Hereinbefore, semiconductor devices according to the present disclosure have been described based on the embodiments; however, the present disclosure is not limited to the above-described embodiments.

For example, the semiconductor devices in the above-described embodiments each are a light-emitting device including light-emitting elements 40, light-transmissive members 50, and second cured silicone resin materials 60; however, the semiconductor devices are not limited to the foregoing. The semiconductor devices may include a different semiconductor element, such as a transistor or a diode, instead of light-emitting element 40, etc.

Moreover, the semiconductor devices in the above-described Embodiments 1 and 2 include third cured silicone resin material 70; however, the semiconductor devices are not limited to the foregoing. For example, in order to facilitate downsizing of a semiconductor device, etc., the third cured silicone resin material 70 part may be cut by dicing in step S19. Moreover, instead of third cured silicone resin material 70, a frame may be formed on mounting substrate 10 using, for example, a different resin material or ceramic.

In addition, in the above-described Embodiment 3, the processes of curing adhesive 60a and dam materials 71a (step S15 and step S34) are included in the manufacturing processes of manufacturing semiconductor devices 3; however, the manufacturing processes are not limited to the foregoing. For example, the process of curing adhesive 60a in step S15 may be omitted; adhesive 60a and dam materials 71a may be cured by application of heat after dam materials 71a are formed. In this case, a process of performing UV light irradiation (step S31) can be omitted, since scattered coating 20a is not formed in the process of curing adhesive 60a.

Furthermore, in the above-described Embodiment 3, thermosetting silicone resin is used as dam material 71a; however, UV-curable silicone resin may be used. In this case, the process of curing dam materials 71a (step S33) can be omitted. Furthermore, in step S34, UV light irradiation for altering a surface of the formed third cured silicone resin materials 71 is performed, in addition to UV light irradiation performed for curing UV-curable silicone resin.

Moreover, in the above-described Embodiments 2 and 3, the semiconductor devices each include thin cured silicone resin material film 20 that is above and in contact with mounting substrate 10; however, the semiconductor devices are not limited to the foregoing. For example, these semiconductor devices may be semiconductor devices not including thin cured silicone resin material film 20 on mounting substrate 10 by preventing the formation of scattered coating 20a. The formation of scattered coating 20a can be prevented by, for example, generating airflow during the process of curing adhesive 60a (step S15).

The present disclosure also encompasses: embodiments achieved by applying various modifications conceivable to those skilled in the art to each of the embodiments; and embodiments achieved by optionally combining the structural elements and the functions of each of the embodiments without departing from the essence of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor devices according to the present disclosure can be used for semiconductor devices that include a covering using a resin material. For example, the semiconductor devices according to the present disclosure are useful for semiconductor devices and the like in which a light-emitting element is used as a semiconductor element, for example.

The invention claimed is:

1. A semiconductor device comprising:
    a mounting substrate;
    a thin cured silicone resin material film above and in contact with the mounting substrate;
    a first cured silicone resin material in contact with the thin cured silicone resin material film; and
    a semiconductor element mounted above the mounting substrate, wherein
    in a whole region in a thickness direction, an oxygen content per unit volume of the thin cured silicone resin material film is higher than an oxygen content per unit volume of the first cured silicone resin material, and
    in a plan view of the mounting substrate, the thin cured silicone resin material film is disposed only outside the semiconductor element.

2. The semiconductor device according to claim 1, wherein
    the semiconductor element is a light-emitting element,
    the semiconductor device further comprises:
        a light-transmissive member disposed above the light-emitting element; and
        a second cured silicone resin material that is disposed between the light-emitting element and the light-transmissive member, and covers at least one of a side face of the light-emitting element or a side face of the light-transmissive member, and
    in a plan view of the mounting substrate, the thin cured silicone resin material film is disposed around and in a vicinity of the side face of the light-emitting element.

3. The semiconductor device according to claim 2, wherein
    the thin cured silicone resin material film has a thickness that monotonously decreases as a distance from the side face of the light-emitting element increases.

4. The semiconductor device according to claim 2, wherein the thin cured silicone resin material film has a thickness that is less than or equal to 0.1 µm.

5. The semiconductor device according to claim 2, wherein
in the whole region in the thickness direction, the oxygen content of the thin cured silicone resin material film is at least 1.1 times the oxygen content of the first cured silicone resin material.

6. The semiconductor device according to claim 2, wherein
a surface of the mounting substrate which is in contact with the thin cured silicone resin material film has light reflectivity to UV light.

7. The semiconductor device according to claim 2, further comprising:
a reflective member having light reflectivity to UV light in a vicinity of the thin cured silicone resin material film, wherein
an oxygen content per unit volume in the whole region in the thickness direction of a part of the thin cured silicone resin material film which is in a vicinity of the reflective member is higher than an oxygen content per unit volume in the whole region in the thickness direction of a part of the thin cured silicone resin material film which is farther away from the reflective member than the part in the vicinity of the reflective member.

8. The semiconductor device according to claim 2, further comprising:
a third cured silicone resin material that is disposed above the mounting substrate and is in contact with an outside of the first cured silicone resin material, wherein
the third cured silicone resin material is a cured material of UV-curable silicone resin.

9. The semiconductor device according to claim 8, wherein
the third cured silicone resin material is light-transmissive to UV light.

10. The semiconductor device according to claim 1, wherein
the semiconductor element is a light-emitting element, the semiconductor device further comprises:
a third cured silicone resin material that is disposed above the mounting substrate and outside the light-emitting element, and surrounds the light-emitting element; and
an other thin cured silicone resin material film that is in contact with the third cured silicone resin material and the first cured silicone resin material,
the first cured silicone resin material is disposed in a region surrounded by the base the third cured silicone resin material, the mounting substrate, and the light-emitting element, and
in a whole region in a thickness direction, an oxygen content per unit volume of the other thin cured silicone resin material film is higher than an oxygen content per unit volume of the first cured silicone resin material.

11. The semiconductor device according to claim 1, wherein
the semiconductor element is a light-emitting element, the semiconductor device further comprises:
a light-transmissive member disposed above the light-emitting element;
a second cured silicone resin material that is disposed between the light-emitting element and the light-transmissive member; and
an other thin cured silicone resin material film that is in contact with (i) a part of the second cured silicone resin material which covers at least one of a side face of the light-emitting element or a side face of the light-transmissive member and (ii) the first cured silicone resin material,
the first cured silicone resin material is disposed above the mounting substrate, and
in a whole region in a thickness direction, an oxygen content per unit volume of the other thin cured silicone resin material film is higher than an oxygen content per unit volume of the first cured silicone resin material.

12. The semiconductor device according to claim 10, wherein
a surface of the mounting substrate on the first cured silicone resin material side has light reflectivity to UV light.

13. The semiconductor device according to claim 11, wherein
a surface of the mounting substrate on the first cured silicone resin material side has light reflectivity to UV light.

14. A semiconductor device comprising:
a mounting substrate;
a thin cured silicone resin material film above and in contact with the mounting substrate;
a first cured silicone resin material in contact with the thin cured silicone resin material film;
a light-emitting element mounted above the mounting substrate;
a conductive pattern formed on the mounting substrate; and
a bump that connects the light-emitting element and the conductive pattern, wherein
in a whole region in a thickness direction, an oxygen content per unit volume of the thin cured silicone resin material film is higher than an oxygen content per unit volume of the first cured silicone resin material, and
throughout the thin cured silicone resin material film, a thickness of the thin cured silicone resin material film is less than a height of the bump.

15. The semiconductor device according to claim 14, further comprising:
a light-transmissive member disposed above the light-emitting element; and
a second cured silicone resin material that is disposed between the light-emitting element and the light-transmissive member, and covers at least one of a side face of the light-emitting element or a side face of the light-transmissive member, wherein
in a plan view of the mounting substrate, the thin cured silicone resin material film is disposed around and in a vicinity of the side face of the light-emitting element.

16. The semiconductor device according to claim 15, wherein
the thin cured silicone resin material film has a thickness that is less than or equal to 0.1 µm.

17. A semiconductor device comprising:
a base;
a thin cured silicone resin material film above and in contact with the base;
a first cured silicone resin material in contact with the thin cured silicone resin material film;
a mounting substrate;
a light-emitting element mounted above the mounting substrate;

a conductive pattern formed on the mounting substrate; and a bump that connects the light-emitting element and the conductive pattern, wherein in a whole region in a thickness direction, an oxygen content per unit volume of the thin cured silicone resin material film is higher than an oxygen content per unit volume of the first cured silicone resin material, and throughout the thin cured silicone resin material film, a thickness of the thin cured silicone resin material film is less than a height of the bump.

18. The semiconductor device according to claim 17, wherein the base is above the mounting substrate and outside the light-emitting element, as at least a part of a frame surrounding the light-emitting element, and the first cured silicone resin material is disposed in a region surrounded by the base, the mounting substrate, and the light-emitting element.

19. The semiconductor device according to claim 17, further comprising:

a light-transmissive member disposed above the light-emitting element, wherein the base is a part of a second cured silicone resin material disposed between the light-emitting element and the light-transmissive member which covers at least one of a side face of the light-emitting element or a side face of the light-transmissive member.

* * * * *